United States Patent [19]
Narahashi et al.

[11] Patent Number: 5,790,555
[45] Date of Patent: Aug. 4, 1998

US005790555A

[54] SIGNAL MULTIPLEXER AND MULTIPLEXING METHOD

[75] Inventors: Shoichi Narahashi, Yokosuka; Ken Kumagai, Yokohama; Toshio Nojima, Yokosuka; Yoshiaki Tarusawa, Yokohama, all of Japan

[73] Assignee: NTT Mobile Communications, Network Inc., Tokyo, Japan

[21] Appl. No.: 663,278

[22] PCT Filed: Dec. 4, 1995

[86] PCT No.: PCT/JP95/02467

§ 371 Date: Jun. 7, 1996

§ 102(e) Date: Jun. 7, 1996

[87] PCT Pub. No.: WO96/18249

PCT Pub. Date: Jun. 13, 1996

[30] Foreign Application Priority Data

| Dec. 5, 1994 | [JP] | Japan | 6-300785 |
| Jan. 31, 1995 | [JP] | Japan | 7-013621 |
| Apr. 3, 1995 | [JP] | Japan | 7-077736 |

[51] Int. Cl.$^6$ ............................................. H04J 1/00
[52] U.S. Cl. ............................................. 370/480
[58] Field of Search ........................... 370/280, 281, 370/294, 252, 204, 321, 337, 344, 347, 318, 324, 350, 480, 482, 481, 488, 535, 536, 537; 375/227, 284, 285, 247, 296, 301, 303, 215, 261, 268, 269, 272, 275, 279, 280, 298, 297, 306, 307, 308, 320, 322, 323, 324, 335, 334, 350, 356, 355

[56] References Cited

U.S. PATENT DOCUMENTS

| 5,278,548 | 1/1994 | Haber | 370/537 |
| 5,519,702 | 5/1996 | Takahashi | 370/537 |

FOREIGN PATENT DOCUMENTS

| 59-154826 | 9/1984 | Japan . |
| 64-69131 | 3/1989 | Japan . |
| 1-238331 | 9/1989 | Japan . |
| 4-355527 | 12/1992 | Japan . |
| 6-132835 | 5/1994 | Japan . |
| 6-204773 | 7/1994 | Japan . |
| 6-204959 | 7/1994 | Japan . |

*Primary Examiner*—Dang Ton
*Attorney, Agent, or Firm*—Pollock, Vande Sande & Priddy

[57] ABSTRACT

The frequencies of input modulated signals fed via ports $11_1$ to $11_n$ are converted by frequency converting parts $12_1$ to $12_n$ to different bands, and the converted outputs are applied to power combining part 24 decides if 16 via variable attenuators $21_1$ to $21_n$, respectively, and provided therefrom as a multiplexed output a portion of which is branched. The envelope power level L is detected by level detecting part 23. Control with the detected level L exceeds a level $L_s$ that is k times the average power of the multiplexed signal k being about 4 to 5, and controls the attenuators $21_1$ to $21_n$ to attenuate the average power of the modulated signal by k/n-fold or less for about $1/\Delta F_0$ (sec), where ($\Delta F_0$ [Hz] is the frequency bandwidth of the multiplexed signal.

38 Claims, 29 Drawing Sheets

FIG. 6
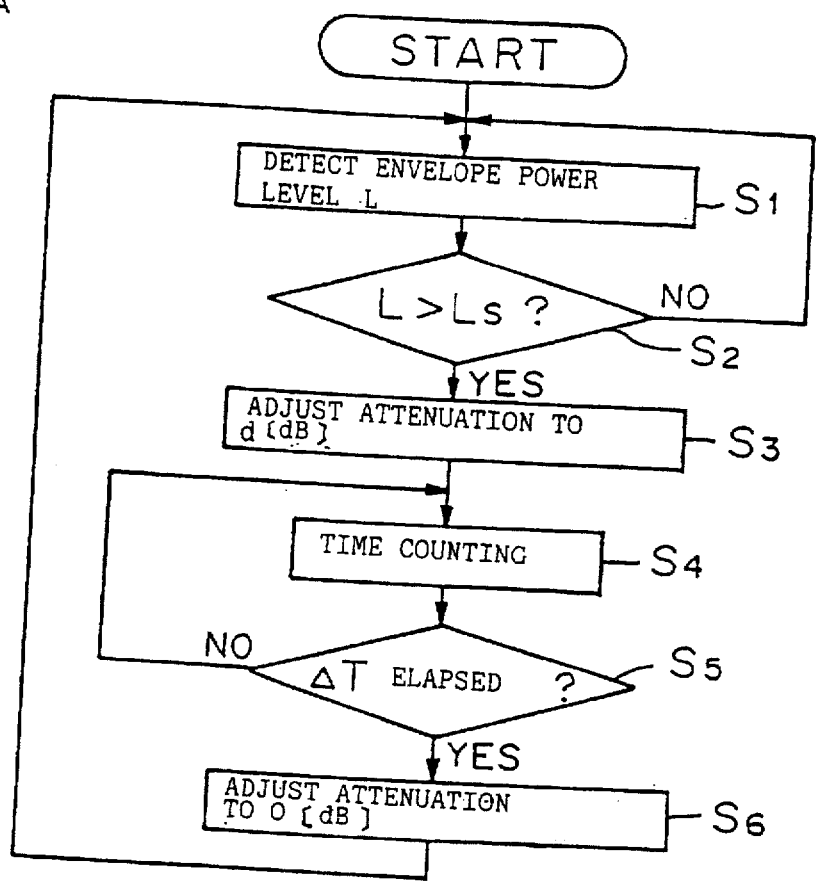
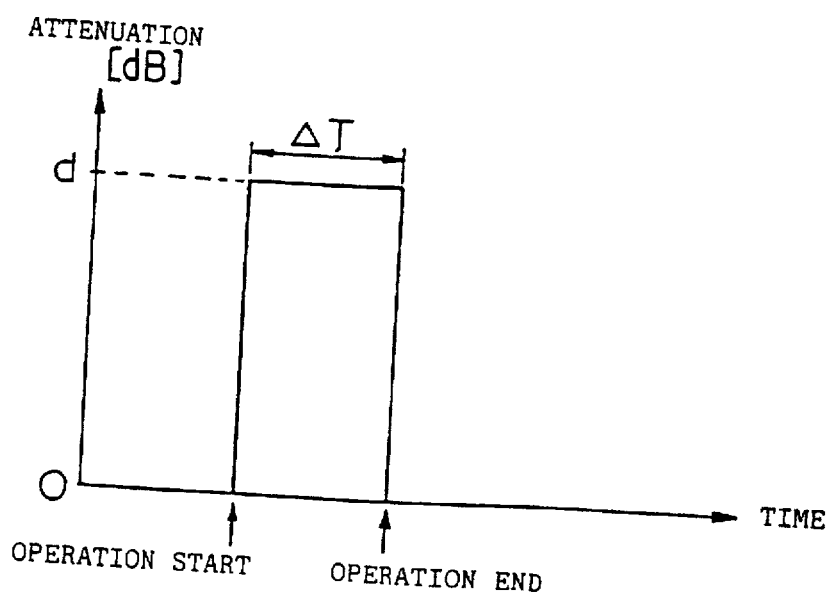

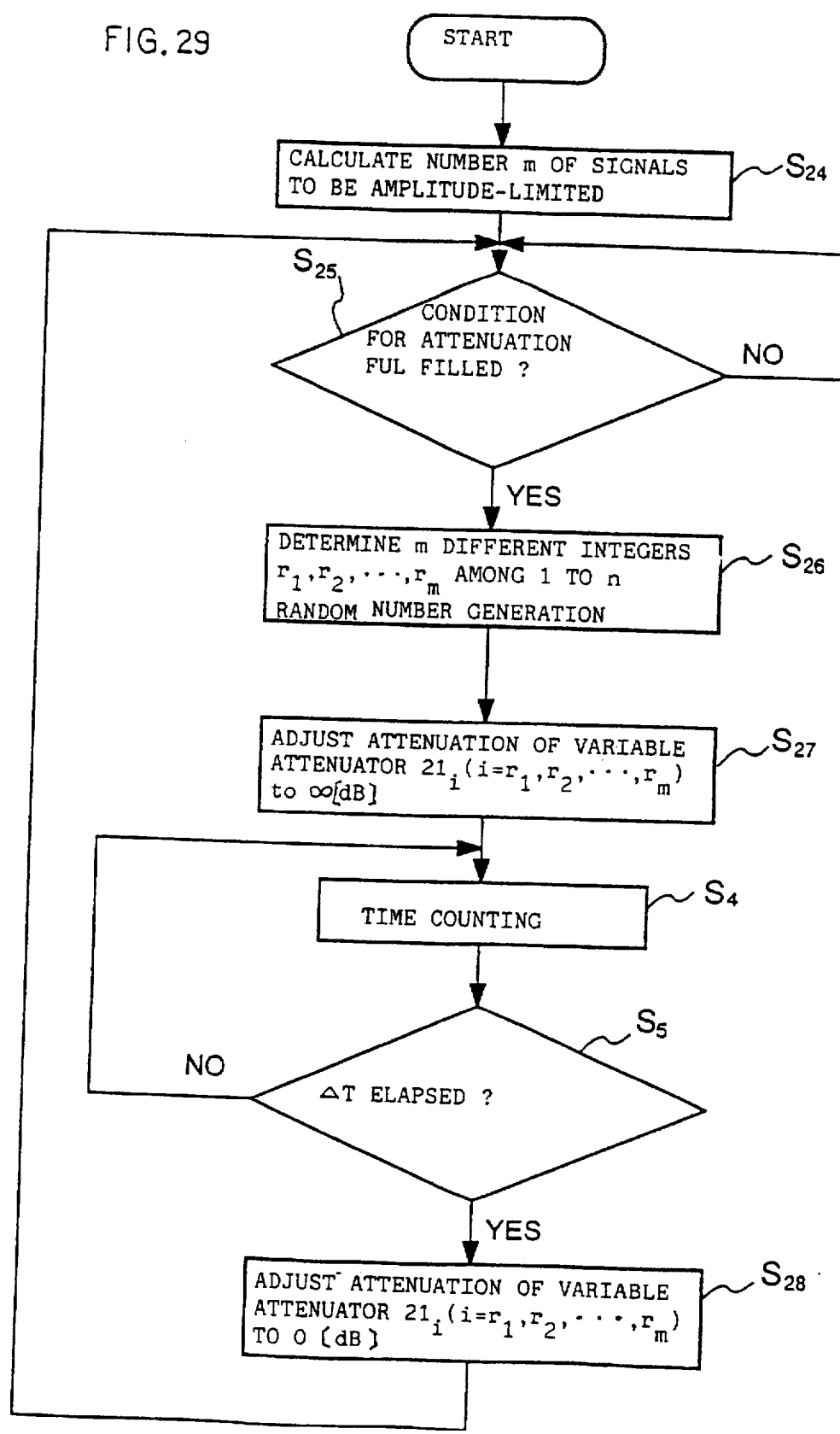

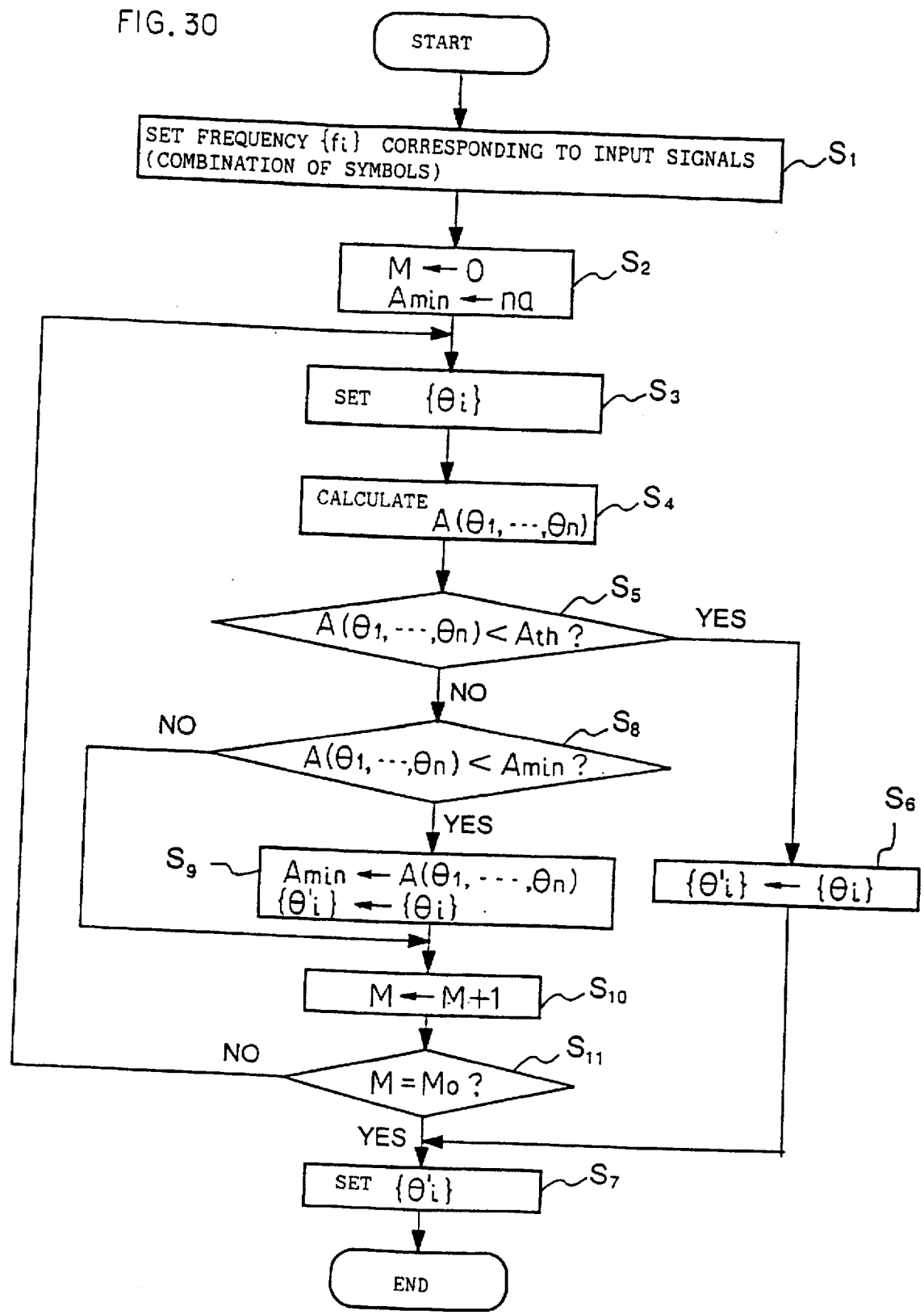

SIGNAL MULTIPLEXER AND MULTIPLEXING METHOD

TECHNICAL FILED

The present invention relates to a signal multiplexer which combines the power of multiple, modulated and different frequency-band signals (hereinafter referred to simply as modulated signals). The signal multiplexer is applied to, for example, a multi-carrier transmission system used in mobile communications, satellite communications or radio paging systems.

BACKGROUND ART

FIG. 1 illustrates a conventional signal multiplexer. Input signals from input port $11_1$ to $11_n$ are converted by frequency converting means $12_1$ to $12_n$ into signals of different frequency bands, respectively. In each frequency converting means $12_i$ (i=1, 2, . . . , n), the frequency of the input signal from the input port $11_i$ is mixed by a multiplier $14_i$ with the frequency $f_i$ of a local signal from a local oscillator $13_i$ and a desired frequency band $f_i'$ is filtered by a band-pass filter $15_i$ from the mixed output as the output of the frequency converting means $12_i$. Here, the input signal from the input port $11_i$ is, for example, a baseband signal which is BPSK modulated, QPSK modulated, QAM modulated or an intermediate frequency signal which is modulated by a certain type of modulation scheme. The output signals from the frequency converting means $12_1$ to $12_n$ are linearly combined by power combining means 16, which provides the combined output to an output port 17. The power combining means 16 linearly combines multiple, modulated and different frequency-band signals that are provided from n input channels and is constructed by a transformer circuit or hybrid circuit. In this way, the n-channel input signals are multiplexed in the frequency space. The multiplexed signal is output from output port 17 as a multi-carrier signal, which is composed of different frequency-band signals and has equally spaced carrier components. In some cases, the band-pass filters $15_1$ to $15_n$ are omitted and instead a band-pass filter is provided at the output side of the power combining means 16.

FIG. 2 shows the basic principle of a conventional m-ary FSK signal multiplexer for m=2. For m>2, the configuration of the multiplexer is the same as in the case where m=2, except that m local oscillators are used. This conventional multiplexer comprises n (n≧2) m-ary FSK modulators $5_i$ (i=1, 2, . . . , n) corresponding to n channels and a power combining means 6. Each m-ary FSK modulator $5_i$ is composed of input ports $1_i$, m (m=2 in this example) local oscillators $2_i$ and $3_i$ which oscillate at different frequencies, and signal switching means $4_i$ which selects and outputs either one of the outputs from the oscillators $2_i$ and $3_i$ in accordance with the code of the input signal to the input port $1_i$. The output signals from the m-ary FSK modulators $5_i$ are different in frequency band and are linearly combined by the power combining means 6 constructed by a transformer circuit or hybrid circuit, and an FSK signal multiplexed in the frequency space is provided at an output port 7.

The local oscillators $2_i$ and $3_i$ are all shown to operate independently of each other. However, in some cases, reference frequency oscillating means is provided and its output is split into all the oscillators $2_i$ and $3_i$ in order to improve the frequency accuracy of all the local oscillators $2_i$ and $3_i$.

As shown in FIG. 3, the m-ary FSK modulator $5_i$ may sometimes be constructed by one oscillating means (usually a PLL synthesizer) which is able to change the frequency of the output signal in accordance with the signal at the input port $1_i$. The circuit configuration in FIG. 3 is identical with that in FIG. 2 except for the provision of reference frequency oscillating means 8 and the configuration of the m-ary FSK modulator $5_i$. The m-ary FSK modulator (PLL frequency synthesizer) $5_i$ in FIG. 3 is made up of low-pass filter means $9_i$, amplifying means $10_i$, a voltage-controlled oscillator (VCO) $41_i$, a variable frequency divider $42_i$ and a phase comparator $43_i$. The phase comparator $43_i$ compares the phases of both signals fed thereto from the reference frequency oscillating means 8 and the variable frequency divider $42_i$. Then, the phase comparator $43_i$ outputs a voltage corresponding to the phase difference between the two signals. The voltage corresponding to the phase difference is applied to a control port of the VCO $41_i$ via the low-pass filter means $9_i$ and the amplifying means $10_i$. The frequency dividing ratio ($1/N_i$) of the variable frequency divider $42_i$ is set in accordance with the input signal $S_i$; the VCO $41_i$ outputs a signal of an oscillating frequency $N_i f_r = N_i f_r$ corresponding to the input signal $S_i$.

It is presupposed hitherto that the above n m-ary FSK modulators $5_i$ are operated at different center frequencies (carrier frequencies). However, in some instances, it may employ a construction wherein the n m-ary FSK modulators $5_i$ are operated at the same center frequency (carrier frequency) and frequency converting means is interposed between the outputs of the m-ary FSK modulators $5_i$ and the power combining means 6 in order to convert the frequency of the output signal from each m-ary FSK modulator $5_i$ to a desired frequency band. The frequency converting means is composed of a frequency synthesizer (or local oscillator), a mixer and band-pass filter means.

Note the envelope power of the multiplexed modulated signal that is obtained at the output port 17 in FIG. 1 in the application of the conventional signal multiplexer to actual communication; since the phases of individual modulated signals are variously distributed in specific ranges, instantaneous phases of the modulated signals readily coincide and the voltages of the instantaneous modulated signals are combined in-phase. As a result, the envelope power sharply increases and a peak envelope power (PEP), which is significantly higher than the average power level of the envelope power, is often generated.

Also in the case of the signal obtained by multiplexing individual m-ary FSK modulated signals, instantaneous phases of the modulated waves generated by the m-ary FSK modulators readily coincide according to the frequencies of the modulated waves and their phases at the time of frequency switching, and at that instant, their voltages are combined in-phase. In consequence, a peak envelope power (PEP) which is drastically higher than the average power $P_a$ of the envelope power occurs as shown in FIG. 4. The peak envelope power PEP can increase up to n times (where n is the number of multiplexing) the average power $P_a$.

In either case, if an amplifier is provided at the output port of the conventional signal multiplexer to amplify the multiplexed signal with a low level of distortion, although the peak envelope power PEP is substantially higher than the average power level of the envelope power, the required saturation power of the amplifier needs to be set larger than the average power level of the envelope power at least by a multiple of the number of multiplexing—this poses the problem of hindering miniaturization and power saving of the amplifier.

As a solution to this problem, there is disclosed in Japanese Pat. Laid-Open Gazette No. 30537/92 a construction in which a phase shifter is provided for each channel and its phase shift amount is suitably set to decrease the peak envelope power. This method makes it possible to prevent a large peak from appearing in the envelope power when each channel is not modulated, and the method is effective for a modulation scheme that holds the initial phase of the carrier as in the case of double-sideband amplitude modulation. However, since a signal modulated by a modulation scheme such as phase or frequency modulation undergoes a change in the carrier phase by the modulated input, a large peak can occur in the peak envelope power of the multi-carrier signal. Further, it is disclosed in FIG. 7 of the above-mentioned Gazette to detect the power of a specific frequency of the multi-carrier signal and control the phase shifter of each channel. However, the Gazette does not concretely state how each phase shifter is controlled in accordance with the detected power; hence, the invention of the Gazette cannot be compared with the present invention in this respect.

In Japanese Pat. Laid-Open Gazette No. 204773/94 (U.S. patent application Ser. No. 963784 filed Oct. 20, 1992) there is disclosed a method that monitors the peak envelope power (PEP) of the multi-carrier signal and, when the PEP exceeds a predetermined value, adjusts the shift amount of the phase shifter in each channel to reduce the peak envelope power PEP of the multi-carrier signal. With this method, since it is not clear how the phase shift amount in each channel is controlled as in the case with the first-mentioned Japanese Laid-Open Gazette, the shift amount of the phase shifter is slightly increased or decreased for each channel, then a check is made to see if the peak envelope power PEP of the multi-carrier signal at that time increases or decreases and the shift amount is controlled to decrease the peak envelope power. Thus, in a very short period of time during which a peak appears in the peak envelope power, the above-mentioned control needs to be effected for each phase shifter; namely, this method requires many high-speed processes and hence is not practical.

In Japanese Pat. Laid-Open Gazette No. 204959/94 (U.S. patent application Ser. No. 964596 filed Oct. 20, 1992), there is disclosed a method that detects the ratio of the peak envelope power PEP to the average power of the multi-carrier signal (PEP/average power) and, when this ratio exceeds a predetermined value, controls the phase shifter of each channel to reduce the peak envelope power PEP. This method also involves many high-speed processes and hence is not practical.

Moreover, in Seymour Shlien, "Miniaturization of the Peak Amplitude of a Waveform," Signal Processing 14 (1988), pp. 91–93, there is made a proposal that uses a steepest descent method to search an initial phase condition that reduces the peak envelope power for a binary FSK multi-carrier signal of 12 carriers of the same amplitude. No concrete circuit configuration is shown; hence, it is not clear how the proposal is implemented. Besides, in U.S. Pat. No. 5,384,547, issued Jan. 24, 1995, there is disclosed a technique that reduces the peak envelope power of a multi-channel signal by attenuating the signal by an amount depending on which of multiple threshold values the peak envelope power has exceeded. In this instance, the peak envelope power of the multi-channel signal is so high that a high-power-endurable variable attenuator is needed, and if the variable attenuator fails, the function of limiting the peak envelope power does not work. Additionally, since this technique effects control of providing attenuation when the peak envelope power exceeds the threshold value even for an extremely short time, the number of times the peak envelope power is limited inevitably increases, giving rise to a problem that the control is performed more than necessary.

It is an object of the present invention to provide a signal multiplexer which prevents a sharp increase in the peak envelope power (PEP) of the multiplexed signal (a multi-carrier signal).

Another object of the prevent invention is to provide a signal multiplexer which prevents a sharp increase in the peak envelope power of the multiplexed signal and produces the signal with a relatively low level of distortion.

Another object of the present invention is to provide a signal multiplexer which multiplexes an m-ary FSK signal and prevents a sharp increase in the peak envelope power of the multiplexed FSK signal.

Still another object of the present invention is to provide a signal multiplexer which multiplexes a plurality of modulated signals and, when the number of signals to be multiplexed increases, prevents a sharp increase in the peak envelope power of the multiplexed signal.

SUMMARY OF THE INVENTION

According to a first aspect of the present invention, in a device which multiplexes modulated signals from n input systems by power combining means, variable attenuator means are respectively connected in series with m' of n input ports of the power combining means for the n (where $m' \leq n$) input systems, the envelope power level of the signal combined by the power combining means or the multiplexed signal is detected by envelope power level detecting means, and when the detected envelope power level exceeds a predetermined value, a predetermined amount of attenuation is set by control means in m (where $m \leq m'$) of the m' variable attenuator means for a predetermined period of time.

The control means sets a predetermined amount of attenuation for a predetermined period of time when the envelope power level exceeds the predetermined value in succession a predetermined number of times. Alternatively, the control means sets a predetermined amount of attenuation for a predetermined period of time when the envelope power level exceeds a predetermined value for more than a predetermined period of time. In this instance, variable attenuator means may be provided between the power combining means and the output port without providing the variable attenuator means for each input system (second aspect).

According to a third aspect of the present invention, in a method which linearly combines n modulated signals into a multiplexed signal, the envelope power level L of the multiplexed signal is detected, then the detected level L is compared with a predetermined level $L_r$, and if $L > L_r$, m of the n (where $m \leq n$) modulated signals are attenuated as predetermined for a predetermined period of time.

According to a fourth aspect of the present invention, in a method which linearly combines n modulated signals into a multiplexed signal, the envelope power level L of the multiplexed signal is detected, then the detected level L is compared with a predetermined level $L_r$, and if $L > L_r$, the multiplexed signal is attenuated as predetermined for a predetermined period of time.

In the third and fourth aspects of the invention, when $L > L_r$, the count value is incremented by one, and when the count value M reaches a predetermined value $M_0$, the predetermined amount of attenuation is provided; if $M < M_0$, then the process goes back to the level detection step, and if $L < L_r$, then the count value M is made zero and the process returns to the level detection step.

In the third and fourth aspects of the invention, if $L > L_r$, then the counting of time T begins and when the time T reaches a predetermined value $T_0$, the predetermined amount of attenuation is provided; if $T<T_0$, then the process immediately returns to the level detection step, and if $L<L_s$, the process goes back to the level detection step after resetting the count value T to zero.

In the first and second aspects of the invention the attenuator means is controlled when the envelope power level of the multiplexed signal exceeds a predetermined value, but according to fifth and sixth aspects of the present invention, the average power of the multiplexed signal is detected by average power detecting means, and when the ratio of the detected envelope power level to the detected average power exceeds a predetermined value, the attenuator means is controlled.

According to a seventh aspect of the present invention, in an FSK signal multiplexer which combines the output signals from n (n-channel) m-ary FSK modulating means (where n and m are both integers equal to or greater than 2) by power combining means; the n m-ary FSK modulating means shift their output frequencies in accordance with the sign of the input signals thereto based upon a common reference frequency signal from reference frequency oscillating means, there are provided variable phase shifter means for shifting the phase of the modulated signal from each m-ary FSK modulated means and control means for setting the phase shift amount of the variable phase shifter means so that the peak envelope power of the output from the power combining means becomes small in accordance with the combination of symbols of the n input signals in synchronization with the timing at which the m-ary FSK modulating means switch their output frequencies in accordance with the input signals thereto.

The m-ary FSK modulating means each comprise m oscillators of different oscillation frequencies and signal switching means which selects one of the m oscillators in accordance with the sign of the input signal thereto and outputs the oscillation signal from the selected oscillator. Alternatively, each m-ary FSK modulation means is constructed by a PLL frequency synthesizer, or the m-ary FSK modulating means and the variable phase shifter means in each channel are constructed by a direct digital frequency synthesizer (DDS).

The input signal in each channel is branched by branching means to both one (common) control means and the corresponding m-ary FSK modulating means, and delay means is inserted in the signal path between the branching means and the m-ary FSK modulating means.

In the cases where each m-ary FSK modulation means is constructed by m oscillators or by a PLL frequency synthesizer, the variable phase shifter means is disposed at the output side of each m-ary FSK modulating means or is connected in series with the reference frequency signal input port of each m-ary FSK modulating means. The control signal for the variable phase shifter means is processed so that the phase of the modulated signal remains continuous before and after its frequency change caused by a change in the sign of the input signal.

The seventh aspect of the invention is combined with the first or second aspect.

BRIEF DESCRIPTION OF THE DRAWINGS

FIG. 6A is a flowchart showing an example of the control operation of control means 24 in FIG. 5 and the procedure of an embodiment according to a third aspect of the invention, and FIG. 6B is a timing chart showing examples of attenuating operations of variable attenuators $21_1$ to $21_n$ in the control operation of the control means and the procedure of the embodiment according to the third aspect of the invention.

FIG. 29 is a flowchart showing the procedure in an embodiment according to the third aspect of the invention.

FIG. 30 is a flowchart showing an example of the procedure for computation of the phase shift amount to be set in variable phase shifter means $47_i$ in the seventh aspect of the present invention.

BEST MODE FOR CARRYING OUT THE INVENTION

Figure 1:
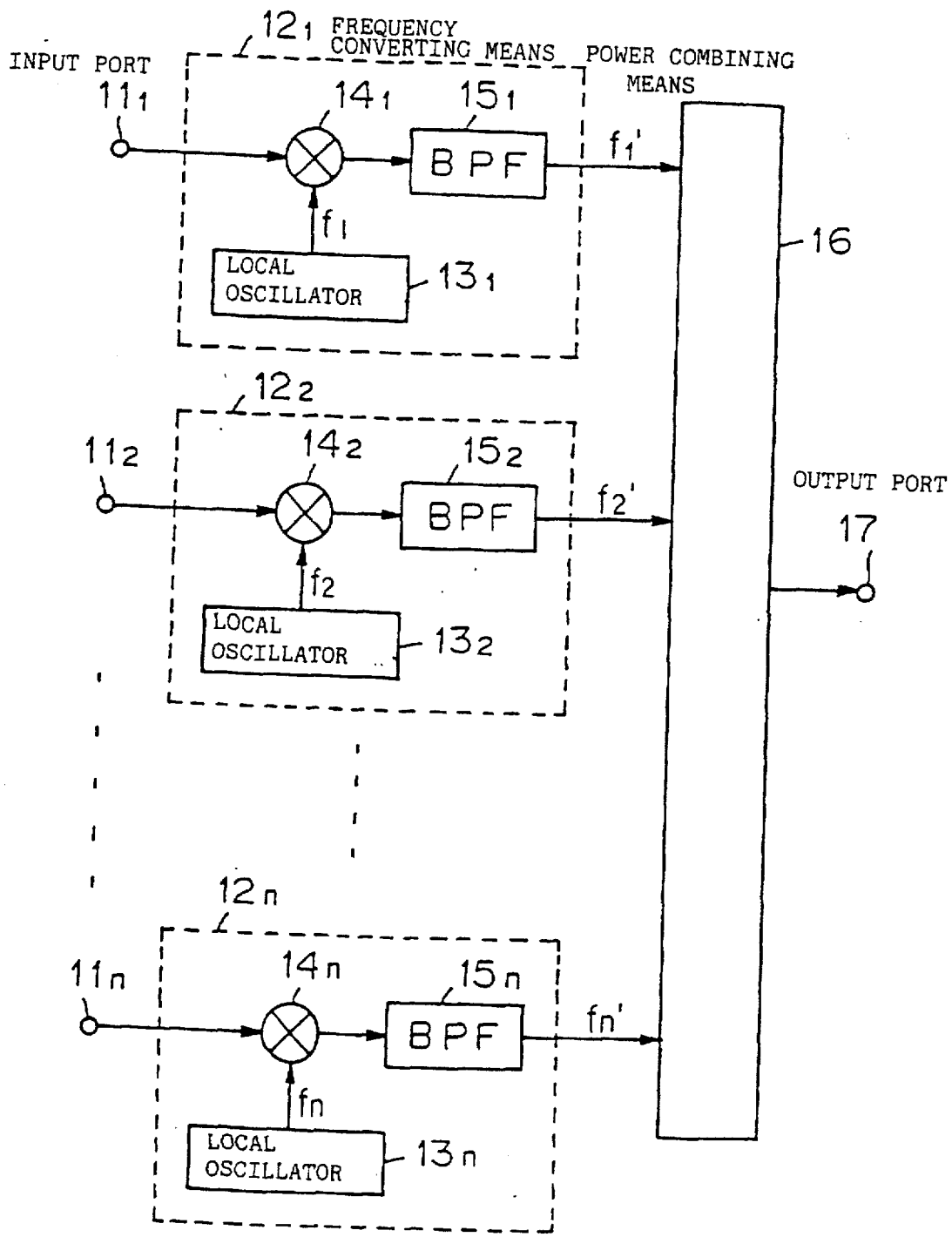
FIG. 1 is a block diagram showing a conventional signal multiplexer.
Figure 5:
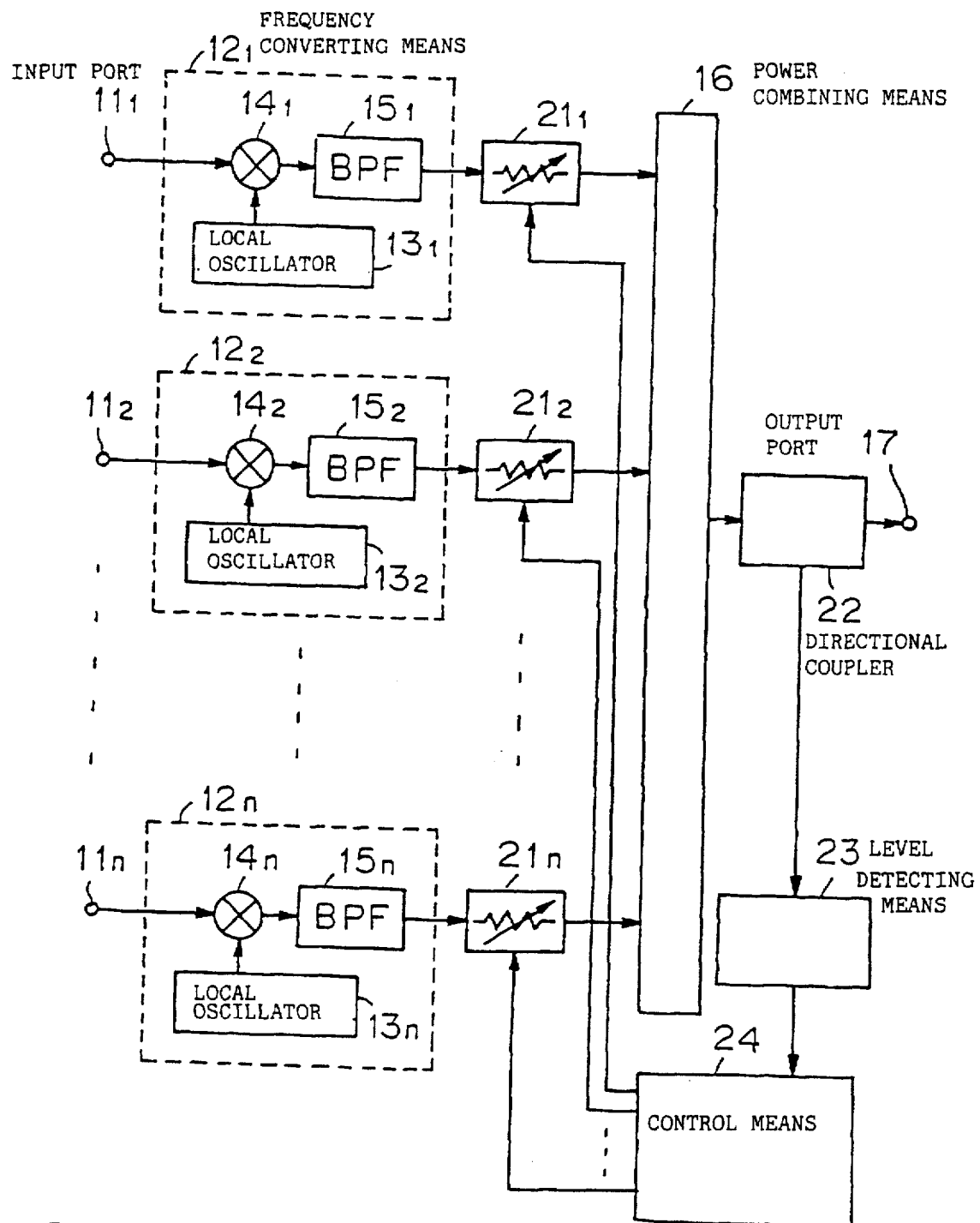
FIG. 5 is a block diagram illustrating an embodiment according to a first aspect of the present invention.

In FIG. 5 there is illustrated an embodiment in accordance with the first aspect of the present invention, in which the parts corresponding to those in FIG. 1 are identified by the same reference numerals. In the present invention: variable attenuators $21_1$ to $21_n$ are provided in output paths of the frequency converting means $12_1$ to $12_n$, respectively; a directional coupler 22 is disposed at the output side of the power combining means 16; level detecting means 23 is provided to detect the envelope power level of the combined output signal or modulated multiplex signal branched by the directional coupler 22; the detected output from the level detecting means 23 is input into control means 24; and the variable attenuators $21_1$ to $21_n$ are controlled by the control means 24. The variable attenuators $21_1$ to $21_n$ can be easily constructed by PIN diodes and varactor diodes; commercially available products can be also used. The level detecting means 23 can be constructed using a diode and a capacitor and detects the level of the envelope power of the combined output signal from the power combining means 16. The control means 24 comprises, as its basic circuit components, an A/D converter, a microprocessor, a ROM, a RAM and a D/A converter and possesses a function of adjusting the setting points of the variable attenuators $21_1$ to $21_n$ while at the same time monitoring the input signal from the level detector 23. In FIG. 6A there is shown a flowchart for explaining the control operation of the control means 24.

To begin with, the envelope power level L of the multiplexed signal is detected by the level detecting means 23 ($S_1$), and it is decided whether the level L exceeds a threshold value $L_s$ ($S_2$). When the level L is in excess of the threshold value $L_s$, the amounts of attenuation of the variable attenuators $21_1$ to $21_n$ are set to d [dB] from 0 [dB] ($S_3$). The operation of the variable attenuators $21_1$ to $21_n$ is limited only to a certain time ΔT as depicted in the timing chart of FIG. 6B; the counting of time ($S_4$) and the check to see if the time ΔT has elapsed ($S_5$) are carried out, and after the elapsed time ΔT, the amounts of attenuation of the variable attenuators $21_1$ to $21_n$ are set again to 0 [dB] ($S_6$), after which control returns to the step of detecting the envelope power level L ($S_1$). When it is found that the level L does not exceed the threshold value $L_s$ at the step $S_2$, control only returns to the step $S_1$ of detecting the envelope power level L and the variable attenuators $21_1$ to $21_n$ are not adjusted.

Letting $\Delta T_0$ (Hz) represent the frequency spacing between adjacent carriers in a multi-carrier signal produced by n multiplexing of modulated signals, the time during which a peak appears in the envelope power of the multi-carrier signal can be estimated by $T_p=1/((n-1)\Delta T_0)$ (sec). This is equal to the reciprocal of the bandwidth of the multi-carrier signal. Hence the time ΔT for attenuation in steps $S_4$ and $S_5$ may preferably be set to $T_p$.

In case of setting the threshold value $L_s$ in step $S_2$ to k (in the range of 1 to 10) times the average power $P_a$ of the multi-carrier signal, the power for each carrier is adjusted by each variable attenuator $21_i$ to k/n-fold or below. In other words, 10 log (k/n) dB attenuation is provided to the variable attenuator $21_i$. From the viewpoint of miniaturization of the amplifier for amplifying the multiplexed signal from the output port 17, it is preferable that k be small, but when k is small, frequent control of the amount of attenuation of the variable attenuator $21_i$ suppresses the amplitude of each modulated signal, resulting in the signal being distorted accordingly. Thus it is not preferable to set k too small; it is practical that k is in the range of 4 to 5.

With constant or intermittent execution of the sequence of control shown in FIG. 6A, when the envelope power level L of the multiplexed signal exceeds the threshold value $L_s$, the output level of the multiplexed signal is attenuated by the variable attenuators $21_1$ to $21_n$ for the predetermined time (ΔT), by which it is possible to prevent a sharp increase in the peak envelope power PEP of the multiplexed signal.

The threshold value $L_s$ is set to a value, for example, about four to five times larger than average operation power of a power amplifier which is connected to the output port 17, though not shown, and it is at most 0.1 μs that the envelope power level of the multiplexed signal having a frequency bandwidth of approximately 10 MHz exceeds a value four to five times larger than the above-mentioned average operating power; that part of the envelope corresponding to the period of the envelope power level higher than the threshold value $L_s$ gradually rises just like an elliptic arc. In the case of the above-mentioned multiplexed signal, signal distortion poses a problem when the part of the envelope corresponding to the power level higher than the threshold value $L_s$ continues 10 ns or longer. Hence in this example, the envelope power level L is detected every several nanoseconds, and when the envelope power level L exceeds the threshold value $L_s$, an attenuation of d=10 dB is set in each of the variable attenuators $21_1$ to $21_n$ for ΔT=0.1 μs. By effecting the detection control in several nanoseconds or less, low-distortion amplification is made possible even if a small amplifier is used.

Figure 7:
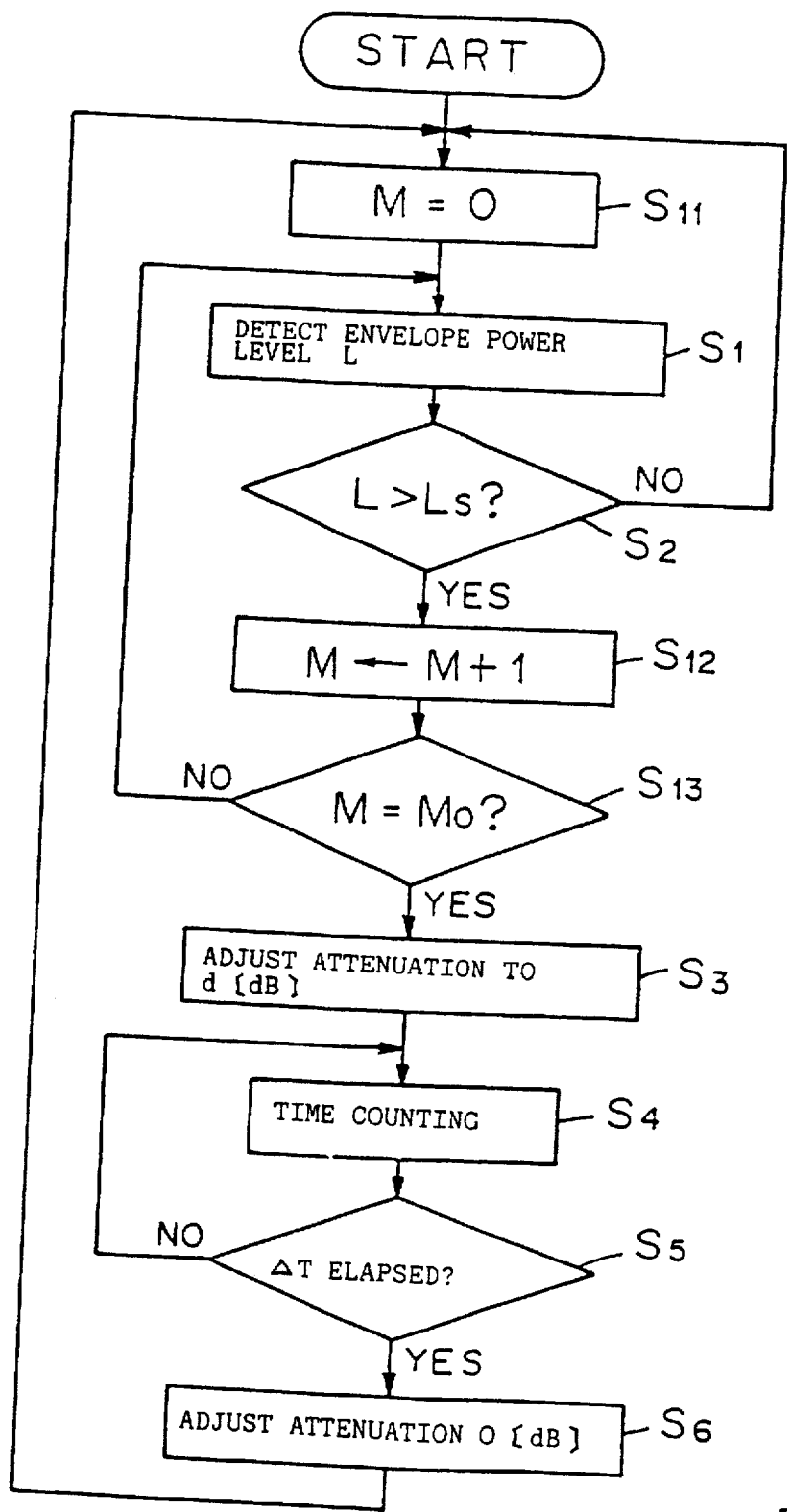
FIG. 7 is a flowchart showing an example of the control operation of the control means 24 in the first and second aspect of the present invention and procedures of embodiments according to the third and fourth aspects of the invention.

With the control scheme shown in FIG. 6A, the variable attenuators $21_1$ to $21_n$ are immediately adjusted when the envelope power level L exceeds the threshold value $L_s$; however, it is also possible to prevent the variable attenuators $21_1$ to $21_n$ from being automatically controlled in response to an instantaneous increase in the envelope power level L not much higher than the threshold value $L_s$, by making provision for adjusting the variable attenuators $21_i$ when the number of times the envelope power level continuously exceeds the threshold value reaches a predetermined value $M_0$. In FIG. 7 there is shown, as a flowchart, the control operation of the control means 24 in this instance.

In the first place, a variable M representing the number of times the envelope power level L exceeds the threshold value $L_s$ is initialized (M=0)($S_{11}$). Next, the envelope power level L of the multiplexed signal is detected by the level detecting means 23 ($S_1$) and a check is made to determine if the level L is higher than the threshold value $L_s$ ($S_2$). When the level L is higher than the threshold value $L_s$, the variable M is incremented by one ($S_{12}$). When the level L is not higher than the threshold value $L_s$, control only returns to step $S_{11}$ wherein M=0 and no adjustment is made to the variable attenuators $21_1$ to $21_n$.

When incremented by one, the variable M is compared with a preset value $M_0$ ($S_{13}$). If the variable M is equal to the preset value $M_0$, then the attenuation amount of the variable attenuators $21_1$ to $21_n$ is changed from 0 [dB] to d [dB] ($S_3$). The variable attenuators $21_1$ to $21_n$ perform the same operations as those described above in respect of FIG. 6A, and after setting the attenuation amount of d for the prescribed time 66 T, control returns to step $S_{11}$.

When the variable M is not equal to the preset value $M_0$, control merely returns to step $S_1$ for the detection of the envelope power level L and no adjustment is made to the variable attenuators $21_1$ to $21_n$.

With constant or intermittent execution of the above-described sequence of control, the output level of the multiplexed signal is attenuated by the variable attenuators $21_1$ to $21_n$ for the predetermined time $\Delta T$ when the envelope power level L of the multiplexed signal continuously exceeds the threshold value $L_s$ $M_0$ times, so that it is possible to prevent a substantial increase in the peak envelope power of the multiplexed signal. In the multi-carrier signal, since individual carrier signals are modulated independently of one another, the frequency of occurrence of the peak envelope power PEP variously changes in accordance with the modulated carrier signals; it is extremely difficult to estimate how many times the peak envelope power PEP will exceed a predetermined level per unit time. That is to say, the peak envelope power PEP might exceed the predetermined level many times in succession or once at a time. Hence, the number of times $M_0$ in the above example is twice or more but several times at most.

Figure 8:
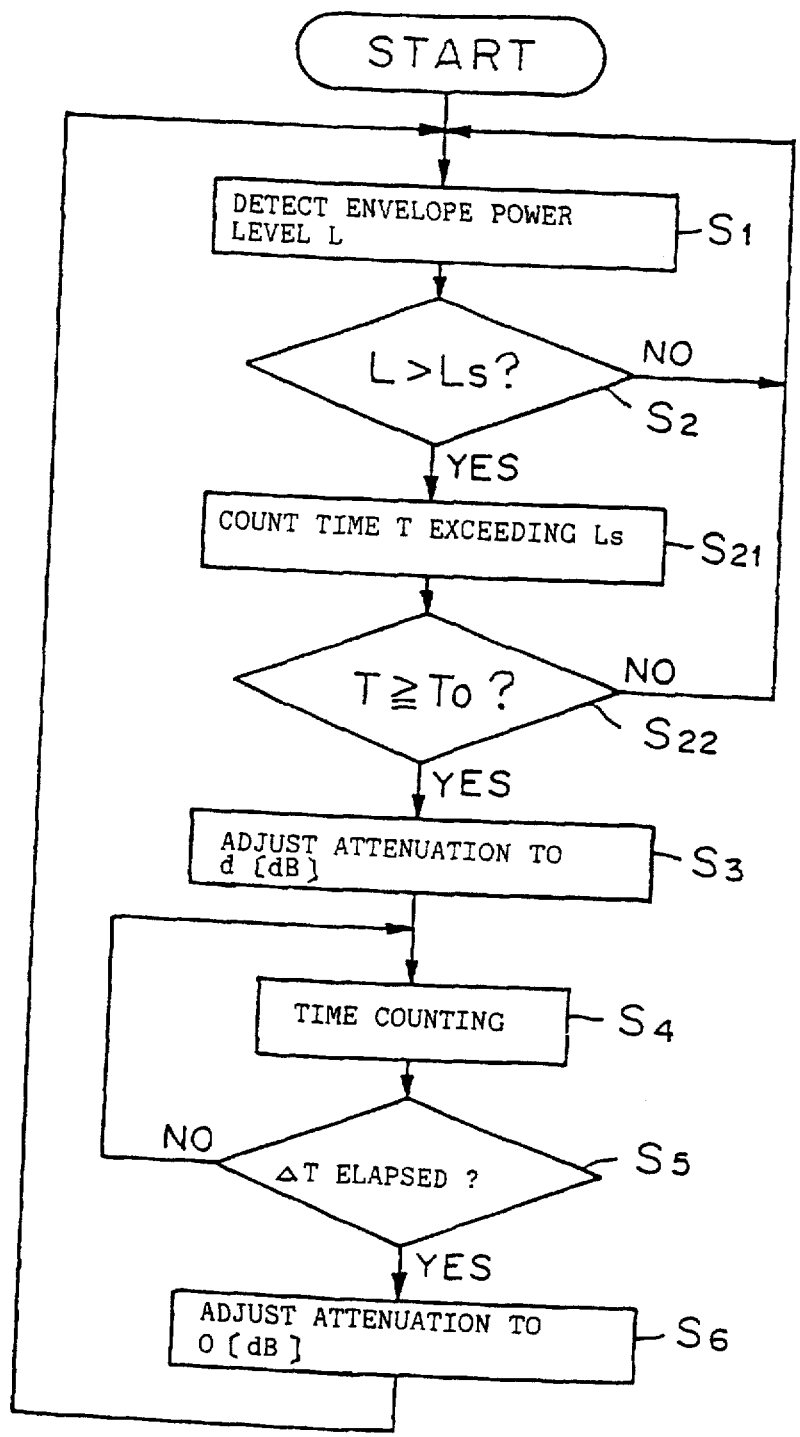
FIG. 8 is a flowchart showing an example of the control operation of the control means 24 in the first and second aspects of the present invention and procedures of other embodiments according to the third and fourth aspects of the invention.

While the control schemes shown in FIGS. 6A and 7 employ, as a decision criterion for adjusting of the variable $21_1$ to $21_n$, the number of times the envelope power level exceeds the threshold level $L_s$, the invention can use, as another criterion, the time during which the envelope power level exceeds the threshold level $L_s$ continuously, in which case, if such a duration is equal to or longer than a predetermined time $T_0$, adjustment is made to the variable attenuators $21_1$ to $21_n$. In FIG. 8 there is shown, as a flowchart, the control operation of the control means 24 in this instance.

The envelope power level L of the multiplexed signal is detected by the level detecting means 23 ($S_1$) and a check is made to determine if the level is higher than the threshold level $L_s$ ($S_2$). When the level L is higher than the threshold level $L_s$, the time T during which L exceeds $L_s$ ($S_{21}$) is measured and compared with the preset value To ($S_{22}$). If the level L does not exceed the threshold value $L_s$, control simply returns to the step $S_1$ for the detection of the envelope power level L and no adjustment is made to the variable attenuators $21_1$ to $21_n$.

When the time T is equal to or longer than the preset value $T_0$, an attenuation amount of d is set in the variable attenuators $21_1$ to $21_n$ for only the time $\Delta T$, after which control returns to step $S_1$ for the detection of the envelope power level L. That is, the processing subsequent to step $S_3$ shown in FIG. 6A is carried out. When it is found in step $S_{22}$ that the time T is shorter than the preset value $T_0$, control simply returns to step $S_1$ for the detection of the envelope power level L and no adjustment is made to the variable attenuators $21_1$ to $21_n$.

With constant or intermittent execution of the above-described sequence of control, the output level of the multiplexed signal is attenuated by the variable attenuators $21_1$ to $21_n$ for only the predetermined time $\Delta T$ when the time during which the envelope power level L continuously exceeds the threshold value $L_s$ is equal to or longer than the preset value $T_0$, so that it is possible to prevent a substantial increase in the peak envelope power PEP of the multiplexed signal. In the above case, the value $T_0$ is set to tens of nanoseconds or so. In the embodiment of FIG. 8, the envelope power level that exceeds the threshold value $L_s$ for an extremely short time does not seriously affect signal distortion, and hence is ignored with a view to reducing the number of times the variable attenuators $21_1$ to $21_n$ are controlled.

Figure 9:
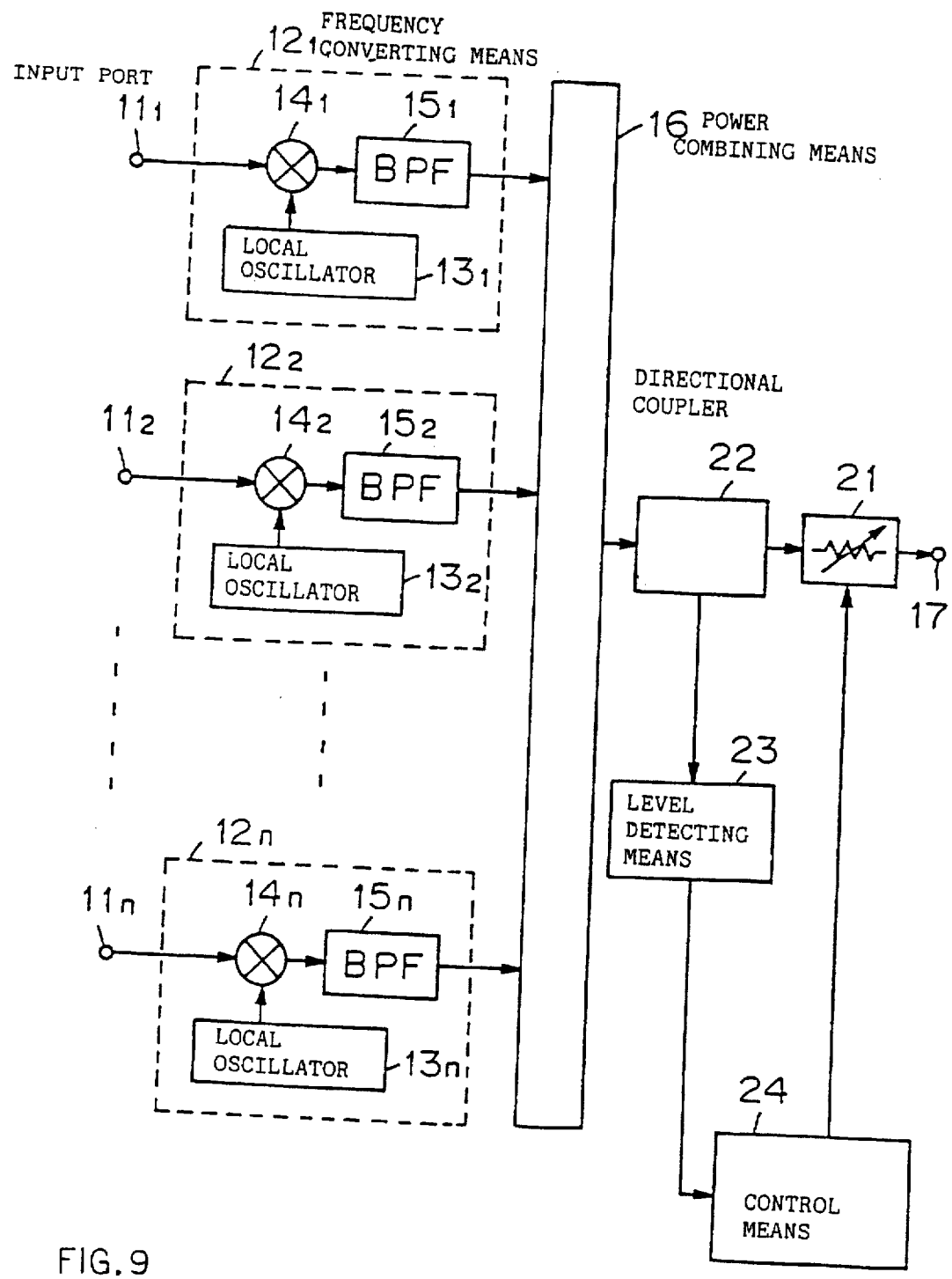
FIG. 9 is a block diagram illustrating an embodiment according to the second aspect of the present invention.

FIG. 9 illustrates an embodiment according to the second aspect of the present invention. This embodiment differs from the FIG. 5 embodiment in the provision of only one variable attenuator 21 at a stage posterior to the directional coupler 22 instead of providing the variable attenuators $21_1$ to $21_n$ in the output paths of the frequency converting means $12_1$ to $12_n$. This embodiment also permits prevention of a substantial increase in the peak envelope power PEP of the multiplexed signal by controlling the variable attenuator 21 alone with a scheme similar to that for controlling the variable attenuators $21_1$ to $21_n$ as described above with reference to FIG. 6A, 7 or 8.

Figure 10:
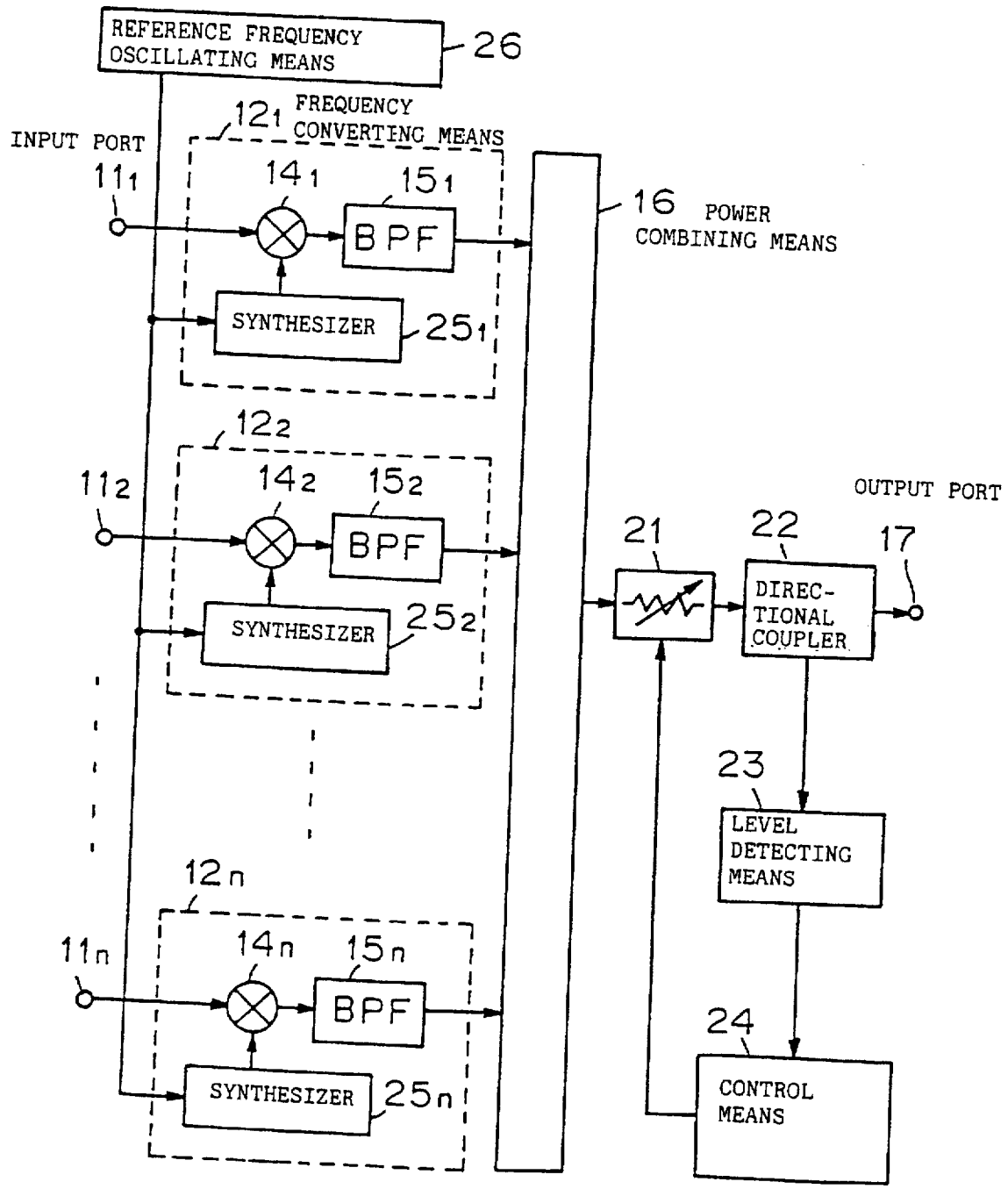
FIG. 10 is a block diagram illustrating another embodiment according to the second aspect of the present invention.

It is also possible to connect only one variable attenuator 21 between the power combining means 16 and the directional coupler 22 as shown in FIG. 10. Alternatively, the variable attenuator 21 may be provided between the power combining means 16 and the output port 17. Further, this embodiment differs from the FIG. 5 embodiment in substituting synthesizers $25_1$ to $25_n$ for the local oscillators $13_1$ to $13_n$ of the frequency converting means $12_1$ to $12_n$ and in driving the synthesizers $25_1$ to $25_n$ by one reference frequency oscillation means 26. With such an arrangement, it is possible to improve the accuracy of the carrier frequency in each of the frequency converting means $12_1$ to $12_n$. The synthesizers $25_1$ to $25_n$ can also be employed in the embodiments of FIGS. 5 and 9.

Figure 11:
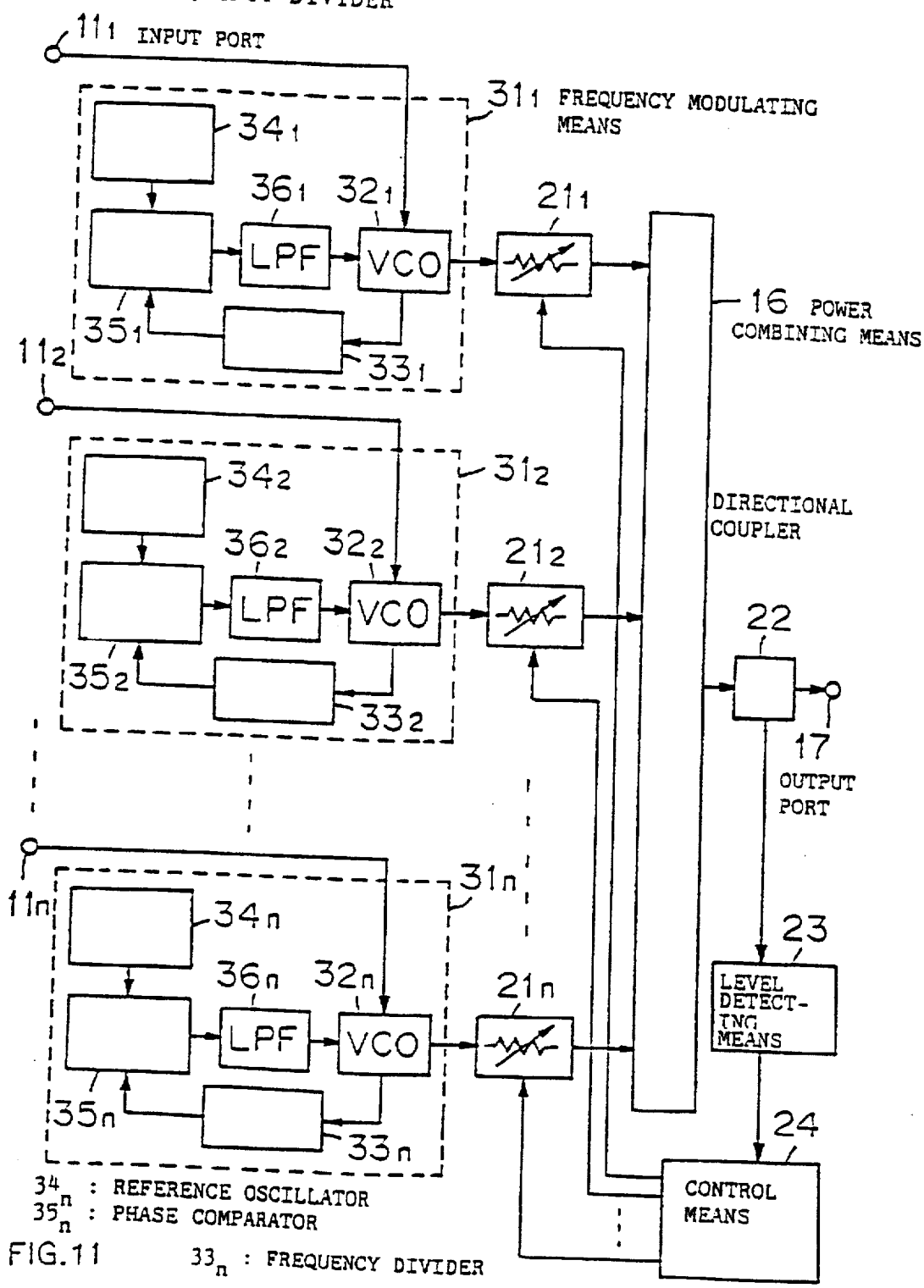
FIG. 11 is a block diagram illustrating another embodiment according to the first aspect of the present invention.

FIG. 11 illustrates an embodiment according to the first aspect of the present invention. This embodiment differs from the FIG. 1 embodiment in substituting frequency modulating means $31_1$ to $31_n$ for the frequency converting means $12_1$ to $12_n$. In the frequency modulating means $31_i$ (where i=1, 2, ..., n) the frequency of the output signal from a VCO $32_i$ is divided by a frequency divider $33_i$; the phase of the frequency-divided output from the frequency divider $33_i$ is compared by a phase comparator $35_i$ with a reference signal from a reference oscillator $34_i$; the phase-compared output from the phase comparator $35_i$ is provided as a control signal to the VCO $32_i$ via a low-pass filter $36_i$; a signal (carrier) is provided from the VCO $32_i$ after the frequency of the signal is decided by both the frequency dividing ratio of the frequency divider $33_i$ and the frequency of the reference signal from the reference oscillator $34_i$ and is stabilized with the stability of the reference signal; and this carrier is modulated in frequency by the input signal from the input port $22_i$ and is output from the frequency modulating means $31_i$. The frequency dividing ratios of the frequency dividers $33_1$ to $33_n$ or/and the oscillation frequencies of the reference oscillators $34_1$ to $34_n$ are set to different values. Accordingly, individual frequency-modulated signals from the frequency modulating means $31_1$ to $31_n$ belong to different frequency bands, and usually the carrier frequencies are set to be equally-spaced. Interposed between the frequency modulating means $31_1$ to $31_n$ and the power combining means 16 are the variable attenuators $21_1$ to $21_n$. This embodiment is identical in construction and operation with the FIG. 5 embodiment except in the points mentioned above.

Figure 12:
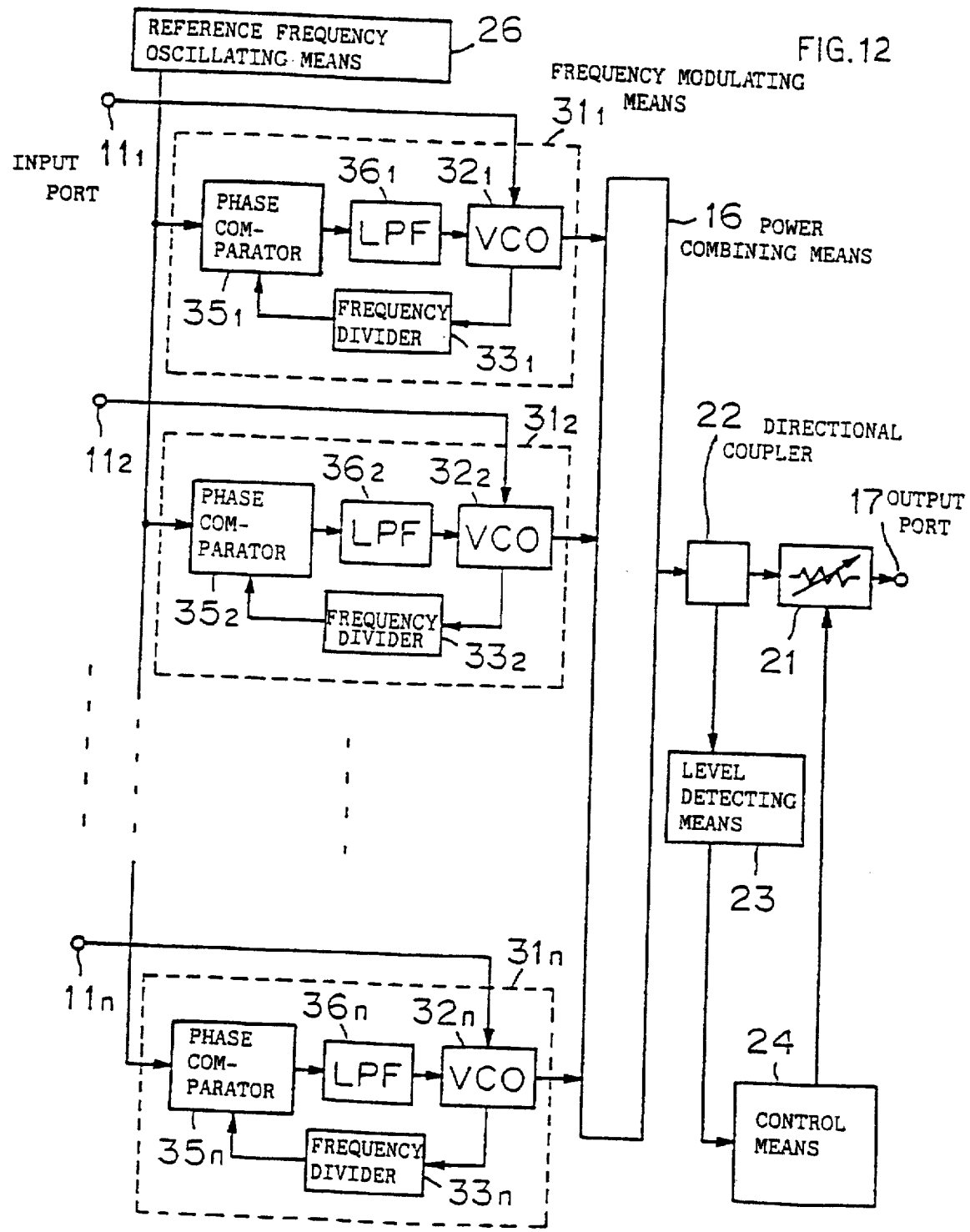
FIG. 12 is a block diagram illustrating another embodiment according to the second aspect of the present invention.

The frequency converting means $12_1$ to $12_n$ in FIGS. 9 and 10 may be replaced with the frequency modulating means $31_i$ to $31_n$ in FIG. 11. For example, as depicted in FIG. 12, the frequency modulating means $31_1$ to $31_n$ in FIG. 11 can be substituted for the frequency converting means $12_1$ to $12_n$ in the FIG. 9 embodiment. The FIG. 12 embodiment employs the common reference frequency oscillation means 26 in place of the reference oscillators $34_1$ to $34_n$ in FIG. 11. The FIG. 11 embodiment may also use the common reference frequency oscillation means 26 as a substitute for the reference oscillators $34_1$ to $34_n$ as shown in FIG. 12. When the frequency modulating means $31_1$ to $31_n$, typically shown in FIGS. 11 and 12, are used, the variable attenuators $21_n$ are controlled by any one of the schemes described previously with respect of FIGS. 6A, 7 and 8.

In the case where the variable attenuators $21_1$ to $21_n$ are separately provided in input paths of the power combining means 16, as shown in FIGS. 5 and 11, and the attenuation amounts for the variable attenuators $21_1$ to $21_n$ are all set equal, the influence on the signal is the same as in the case where the multi-carrier signal is attenuated after being multiplexed. In the embodiments of FIGS. 9 and 12, when the peak envelope power PEP exceeds the predetermined values, all carrier (modulated) signals are equally limited (or suppressed)—this is equivalent to intentional distortion of all carrier signals and there are some cases where the information error of each carrier signal arises.

Figure 13:
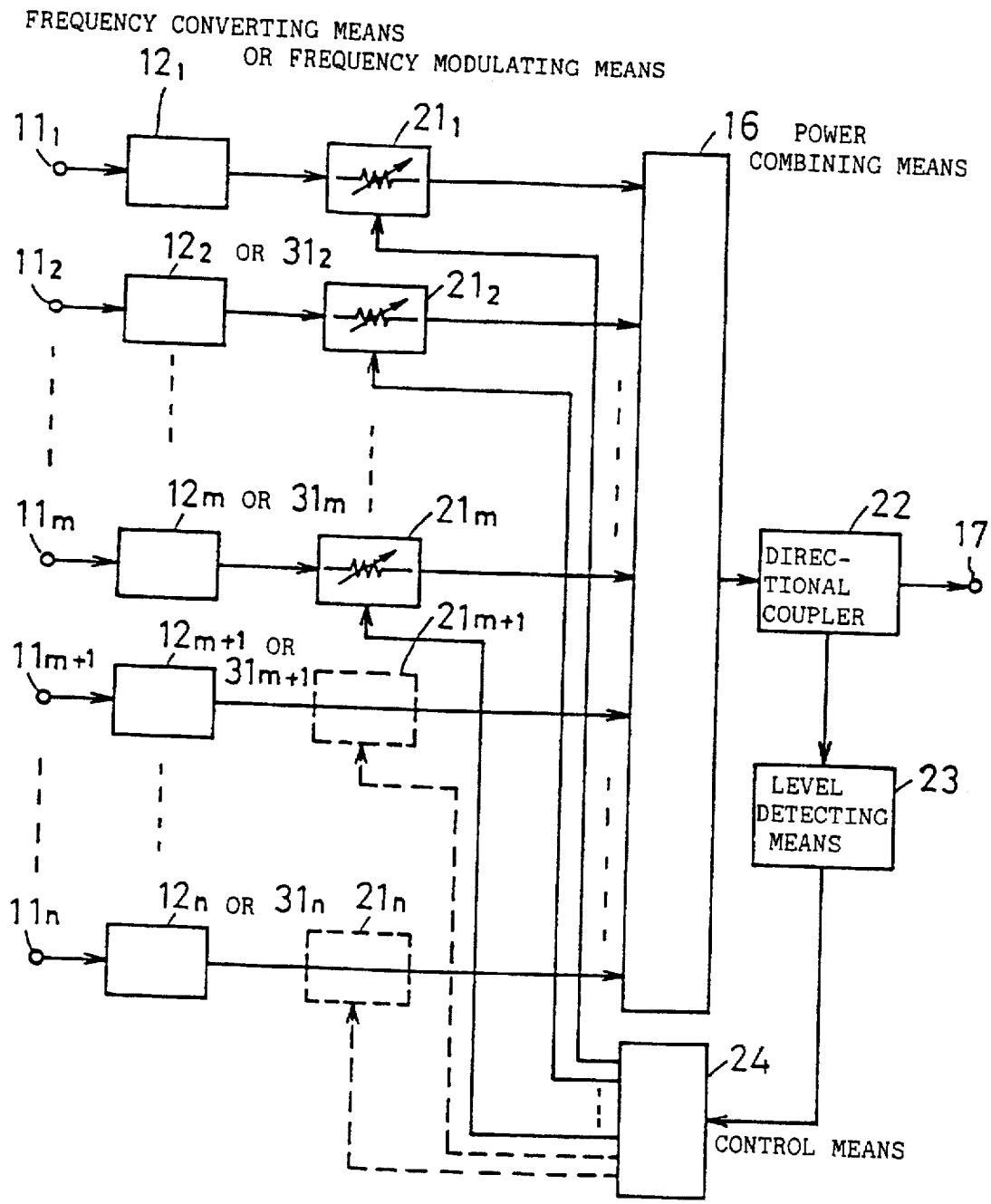
FIG. 13 is a block diagram illustrating another embodiment according to the first aspect of the present invention.

For reducing the envelope power of the multi-carrier signal, there is no need to limit the amplitudes of all the carriers (modulated signals) equally. The envelope power from the power combining means 16 could be reduced to a desired level by such an arrangement as shown in FIG. 13, wherein the modulated signals to be multiplexed, that is, the outputs from the frequency converting means $12_1$ to $12_n$ (or frequency modulating means $31_1$ to $31_n$) are divided into those to limit the amplitudes and those not to limit, variable attenuators $21_1$ to $21_m$ are provided for limiting the amplitudes of output signals from m frequency converting means $12_1$ to $12_m$, and the output sides of the other frequency converting means $12_{m+1}$ to $12_n$ are connected directly to the power combining means 16. To perform this, the value m is chosen as described below.

Let the average power per modulated signal be represented by $P_0$ and the number of modulated signals (or multiplexing number) by n, and suppose that the envelope power of the multi-carrier signal is suppressed when it exceeds k times of the overall average power ($P_a = nP_0$) of the multi-carrier signals. In this instance, the peak envelope power PEP of the (n-m) non-amplitude-limited modulated signals reaches a maximum value of $(n-m)^2 P_0$. Since the maximum value is required to be smaller than the predetermined power $knP_0$, it is necessary to satisfy the following condition:

$$(n-m)^2 P_0 \leq knP_0 \qquad (1)$$

From this equation it follows that $$m \geq n - \sqrt{kn} . \qquad (2)$$

Of the n modulated signals, m or more modulated signals need only to be controlled for attenuation. In this way, at least m modulated signals whose amplitudes are to be limited are chosen in ascending order of severity of limitations on information errors.

Now, consider the case where the amplitudes of all the carriers are equally limited. Let it be assumed that the power per carrier, after being limited, is $xP_0$ (where x<1). The overall average power of the multi-carrier signal in this case is $xnP_0$ and the peak envelope power PEP reaches a maximum of $xn^2 P_0$. Since it is necessary that the peak envelope power be smaller than the predetermined power $knP_0$, $$xn^2 P_0 \leq knP_0 \qquad (3)$$

Therefore, $$x \leq k/n. \qquad (4)$$

Consider the case where n=16 and k=5, for instance. For dividing the output signals from the frequency converting or modulating means into those to limit the amplitudes and those not to limit, n−m≦8 is obtained from Eq. (2). That is, the amplitudes of eight carriers of a total of 16 carriers are not limited and the amplitudes of the other remaining carriers are all reduced to zero when their peak envelope power PEP exceeds a predetermined value—this makes it possible to prevent the peak envelope power of the multi-carrier signal from exceeding a value larger than five times the average power of all the carriers involved. For equally limiting all the carriers, $x \leq 5/16$ is obtained from Eq. (4). By controlling its amplitude when the peak envelope power exceeds a predetermined value, each carrier will lose its power by more than half. In this case, an error can occur in the information of each carrier.

As will be seen from the above, the direct reduction of the envelope power of the multi-carrier signal is equivalent to the equal limitation of the amplitudes of all the carriers; in this instance, there is the possibility of all the carriers having wrong information. In contrast to this, in the case where a variable attenuator is provided for each carrier and the amplitudes of the modulated signals belonging to a specified group are limited, it is possible to preclude the possibility of errors arising in the information of the non-amplitude-limited modulated signals.

When one variable attenuator 21 is provided for the multi-carrier signal as shown in FIGS. 9, 10 and 12, there arise problems that the variable attenuator 21 needs to be a high power-endurable type one since the peak envelope power PEP of the multi-carrier signal is large, and that the function of limiting the peak envelope power PEP will be lost if the variable attenuator 21 fails. On the other hand, when the variable attenuator $21_i$ is provided for each carrier, the attenuator may be a low power-endurable type since the peak envelope power PEP per carrier is not large, and even if one of the variable attenuators $21_i$ fails, the peak envelope power PEP of the multi-carrier signal can be suppressed; though the function is not enough but to some extent. As will be understood from the aforementioned group control, x in the amount of power to be limited, $xP_0$, is changed with the number of failing variable attenuators and the group control is effected accordingly. It is also possible to employ an arrangement such as indicated by the broken lines in FIG. 13, in which variable attenuators $21_m$ to $21_n$ are additionally provided in the channels wherein no amplitude control normally takes place, that is, the variable attenuators $21_i$ are provided in all the channels; in this instance, the variable attenuators primarily intended for control are selected, but if one or more of them fail, then those of the additionally provided variable attenuators corresponding to the failing ones can be selected as the substitutes therefor. In this way, the influence of failures of the variable attenuators $21_i$ can be lessened. The above advantage comes solely from the provision of the variable attenuator for each carrier.

Furthermore, in the case where the variable attenuators $21_i$ are provided in all the channels but attenuation control is carried out for only m attenuators and the amounts of attenuation are set for zero for the other remaining n−m variable attenuators, it is possible to adopt a control scheme which, upon completion of each or several control operations for the variable attenuators, changes the group of the m variable attenuators to be controlled so that signal distortions by the amplitude limitation are made as uniform as possible in all the channels. For example, in the case of 16 channels the variable attenuators are divided into a group $21_1$ to $21_8$ and a group $21_9$ to $21_{16}$, and the two groups are alternately controlled.

The changing of the variable attenuators $21_i$ to be controlled as described above can be made as uniform as possible for all the channels by using such a scheme as shown in FIG. 29.

To begin with, the number m of variable attenuators to be controlled is calculated ($S_{24}$). Letting the number of modulated waves be represented by n and assuming that the envelope power level is held smaller than k times (set as $L_s$) of the overall average power of the multi-carrier signal, the number m can be obtained from Eq. (2), that is, $m \geq n - \sqrt{kn}$. Next, a check is made to determine if the condition for controlling the variable attenuators, that is, any of the conditions in step $S_2$ of FIG. 6A, in step $S_{13}$ of FIG. 7 and in step $S_{22}$ of FIG. 8 is satisfied ($S_{25}$). If the condition is fulfilled, m different integers $r_1, r_2, \ldots, r_m$ among 1 to n are determined by the use of random number generating means ($S_{26}$). The random number used here is, for instance, a uniform random number in the sense that any integers are equally likely to be selected. With the use of the uniform random number, any variable attenuators $21_i$ are uniformly selected. Further, since there are well-known methods for generating random numbers having other statistical distributions such as exponential, normal and similar specific distributions by the use of the uniform random number (see, for instance, W. H. Press, B. P. Flannery, S. A. Teukolsky and W. T. Vetterling, "Numerical Recipes in C." Cambridge, N.Y., 1990, Chapter 7), random numbers other than a uniform one can also be employed. In short, any random numbers can be used as long as they serve the purpose of randomly selecting the variable attenuators $21_i$.

Next, the amounts of attenuation of the variable attenuators $21_i$ (where $i = r_1, r_2, \ldots, r_m$) suffixed with the determined integers $r_1, r_2, \ldots, r_m$ are set to $\infty$ [dB] for a predetermined period of time ($\Delta T$) ($S_{27}$). After the elapsed time $\Delta T$ since setting the attenuation to $\infty$ ($S_4$, $S_5$), the attenuation amount of the controlled variable attenuators $21_i$ (where $i = r_1, r_2, \ldots, r_m$) is reset to 0 [dB] and the process returns to step ($S_{25}$) for monitoring the envelope power level L ($S_{28}$).

With this scheme, the variable attenuators that are selected for control are determined by random numbers each time the envelope power level of the multi-carrier signal satisfies the condition for attenuation control. That is, the group of m variable attenuators is changed.

For instance, when n=16 and k=5, m≧8, but assume here that m=8. In this instance, eight integers are selected from among 1 to 16 by using the above-mentioned random numbers. If the eight different integers selected by the random numbers are, for example, 1, 3, 4, 6, 8, 10, 12 and 15, the variable attenuators to be controlled are $21_1$, $21_3$, $21_4$, $21_6$, $2_8$, $21_{10}$, $21_{12}$ and $21_{15}$. Also in this case, the group of 60 variable attenuators to be controlled for attenuation may be changed by the random number generation each time the control for the variable attenuators has been effected a predetermined number of times.

As described above, the modulated signals of all the channels (input routes) need not always be equally attenuated and no attenuation control is required for the modulated signals of some channels; accordingly, it is possible to adopt a control scheme that divides all the channels into a plurality of groups and provides a different attenuation amount for each group when the peak envelope power of the multi-carrier signal exceeds a predetermined value. For instance, in the case where the channels are divided into two groups, the attenuation amount for the two groups are selected different about 3 to 5 dB so that the modulated signals, which are required to have a far-lower error rate, are attenuated slightly. In extreme cases, a different attenuation amount may be provided for each channel (input routes). Besides, it is possible to change, when required, the channels in which to greatly attenuate the modulated signals; hence, in FIGS. 5, 9, 10, 11 and 12, the variable attenuators $21_1$ to $21_n$ are each provided in one of the channels and these variable attenuators $21_1$ to $21_n$ are adapted to be separately controllable by the control means 24.

Figure 14:
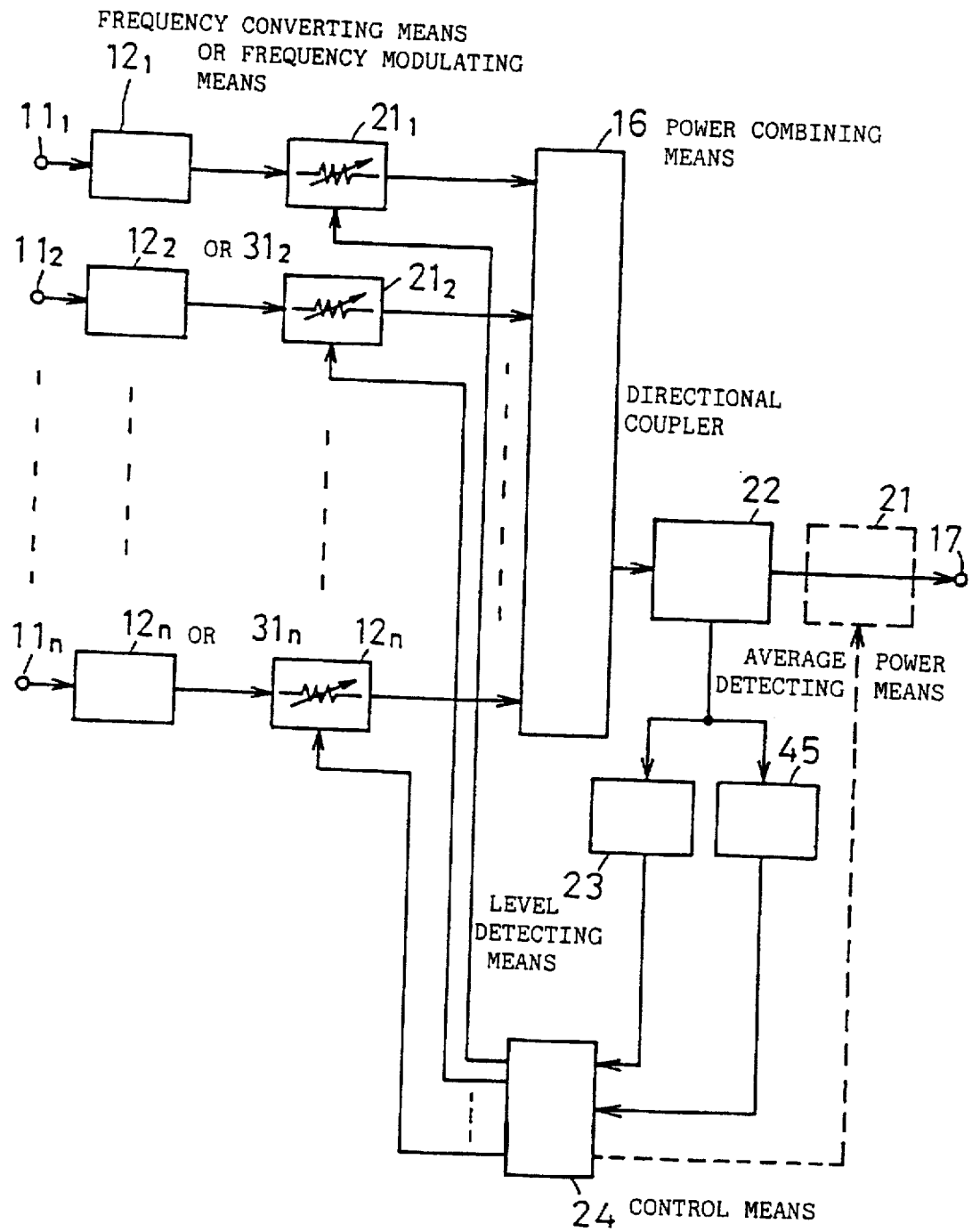
FIG. 14 is a block diagram illustrating an embodiment according to a fifth (sixth) aspect of the present invention.

While in the above the envelope power level (PEP) of the multi-carrier signal or the combined output signal from the power combining means 16 is detected by the level detecting means 23 and a check is made to determine if the detected level L is higher than threshold value $L_r$, it is also possible to employ such a configuration as shown in FIG. 14 wherein the parts corresponding to those in FIGS. 5, 9, 10, 11 and 12 are identified by the same reference numerals and wherein the output from the directional coupler 22 is fed not only to the level detecting means 23 but also to average power detecting means 45 to detect the average power $P_a$ of the multi-carrier signal as well, a ratio $L/P_a$ of the peak envelope power PEP detected by the level detecting means 23 or the detected level L to the average power $P_a$ is calculated by the control means 24, then a check is made to see if the ratio $L/P_a$ exceeds a predetermined value A, and if so, a predetermined attenuation amount is set in one or more of the variable attenuators $21_1$ to $21_n$ for the predetermined period of time $\Delta T$. In this instance, the variable attenuators may be controlled when the number of times the ratio $L/P_a$ continuously exceeds the predetermined value A reaches the predetermined value $M_0$ as shown in FIG. 7, or the variable attenuators may be controlled when the $L/P_a$ exceeds the value A for longer than the predetermined period of time $T_0$ as shown in FIG. 8. Further, it is also possible to omit the variable attenuators $21_1$ to $21_n$ in FIG. 14 and provide a variable attenuator 21 at the output side of the power combining means 16 as indicated by the broken lines.

Figure 2:
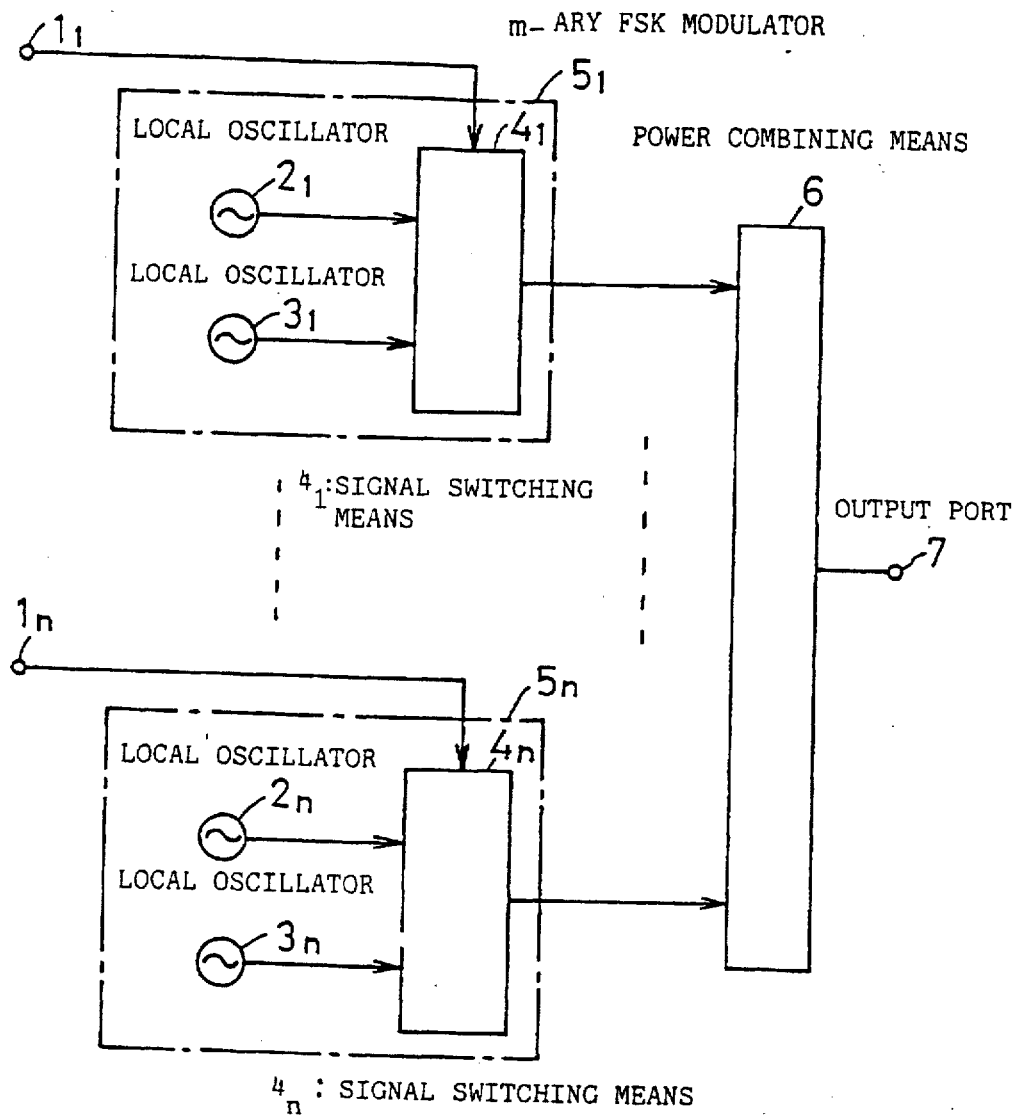
FIG. 2 is a block diagram showing the principles of a conventional FSK signal multiplexer.
Figure 15:
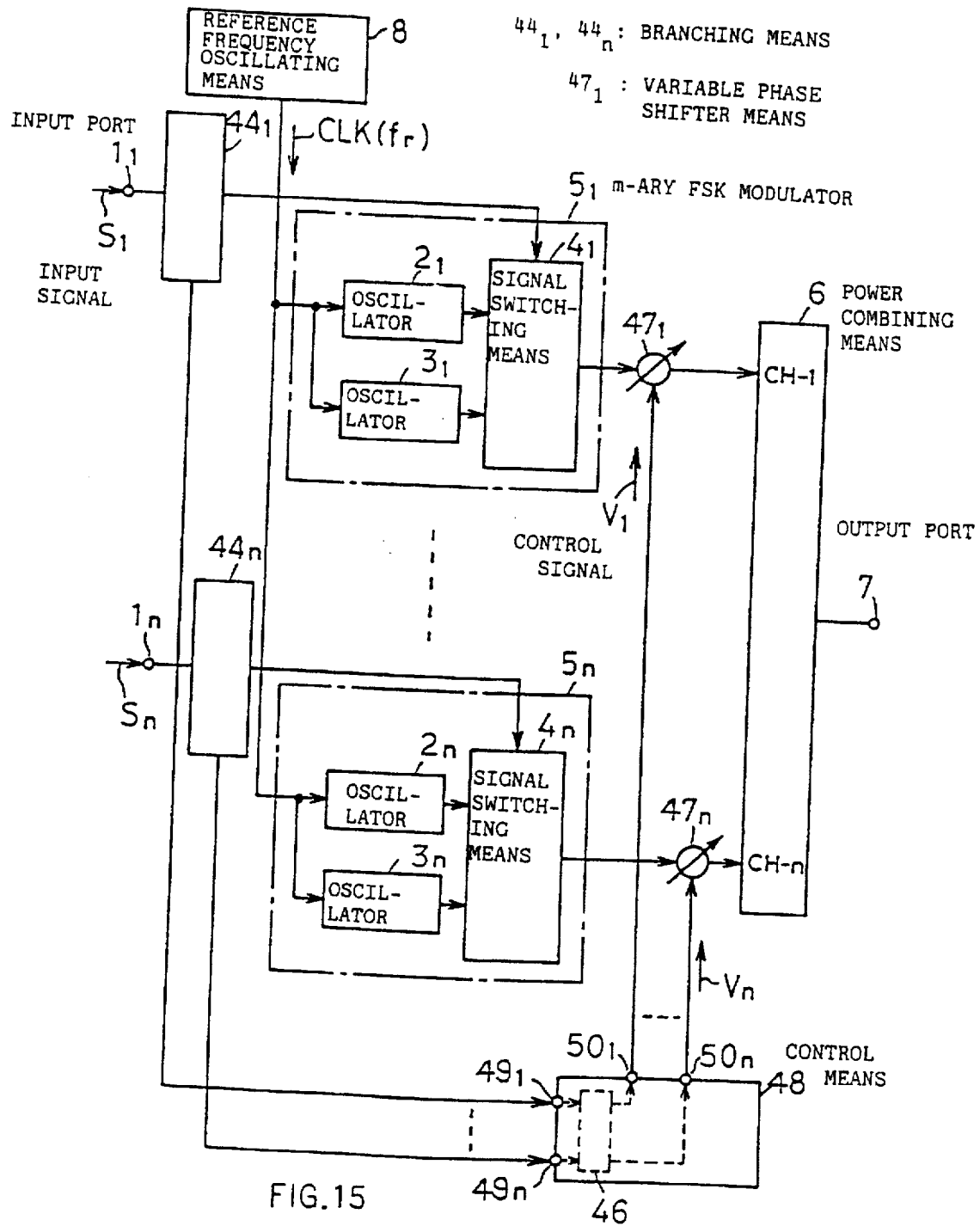
FIG. 15 is a block diagram illustrating an embodiment according to a seventh aspect of the present invention.

Next, a description will be given of an embodiment according to the seventh aspect of the present invention which is applied to the multiplexing of FSK modulated signals. FIG. 15 shows the case where m=2, the parts corresponding to those in FIGS. 2 and 3 being identified by the same reference numerals. In the case where m>2, the device configuration is the same as in the case of m=2 except that the m-ary FSK modulator $5_i$ includes m oscillators. In this embodiment, one reference frequency oscillation means 8 is provided and variable phase shifter means $47_i$ are connected between n (where n≧2) m-ary FSK modulators $5_i$ (where i=1, 2, ..., n) and input ports of respective channels of power combining means 6. The reference frequency signal CLK from the reference frequency oscillating means 8 is provided to the oscillators $2_i$ and $3_i$ constructing each m-ary FSK modulator $5_i$, and since the oscillation frequencies of the oscillators $2_i$ and $3_i$ are synchronized with the reference frequency signal CLK, the oscillator output signals have the same initial phase. The phase of the output signal from each m-ary FSK modulator $5_i$ is adjusted by the variable phase shifter means $47_i$ corresponding thereto. The input signal $S_i$ fed via the input port $1_i$ is branched by branching means $44_i$ into two routes and input into the m-ary FSK modulator $5_i$ and a control input port $49_i$ of control means 48, respectively. The control means 48 sets and adjusts the phase shift amount of each variable phase shifter means $47_i$ in accordance with a combination of symbols of input signals $S_1$ to $S_n$, that is, a combination of n frequencies of the outputs from the n m-ary FSK modulators $5_i$ (outputs of the oscillators $2_i$ or $3_i$) in synchronization with the timing at which the output frequency of each m-ary FSK modulator $5_i$ changes. Of course, symbols of the input signals $S_1$ to $S_n$ are synchronized with one another.

The variable phase shifter means $47_i$ is a well-known device that can be constructed by a circulator, a variable delay line, or a varactor diode (refer to Miyauchi and Yamamoto, "Microwave Circuits for Communications" pp. 314–321, the Institute of Electronics, Information and Communication Engineers of Japan, 1981), and a commercially available product can be also used. The variable phase shifter means $47_i$ adjusts the phase of the output signal from the corresponding m-ary FSK modulator $5_i$. The control means 48 comprises, as basic circuit components, an A/D converter, a microprocessor, a ROM, a RAM, a D/A converter and a filter, and in accordance with the combination of symbols of the input signals fed to its control input ports $49_i$ (where i=1 to n), the control means outputs via its control output ports $50_i$ control signals $V_i$ which adjust the phase shift amounts of the variable phase shifter means $47_i$ (where i=1 to n) to predetermined values. The operation of the control means 48 will be described below.

Figure 16:
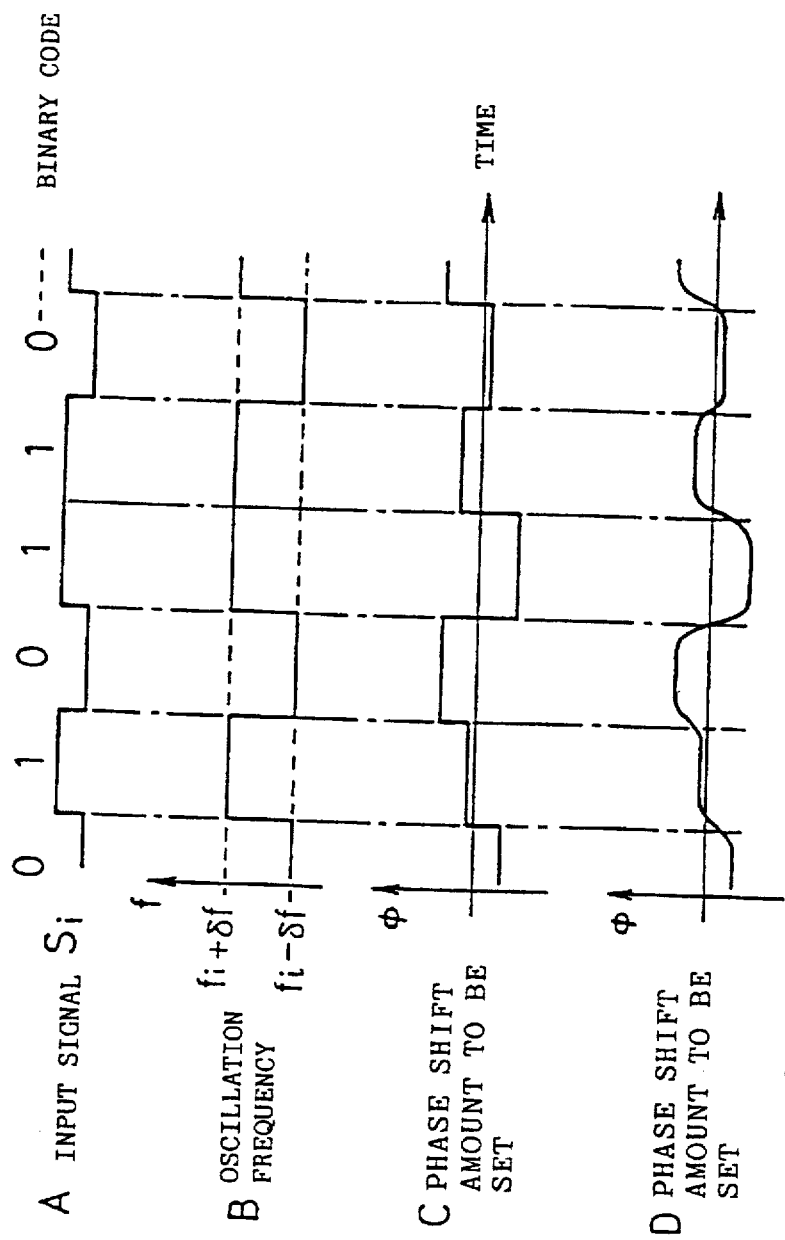
FIG. 16 is a timing chart showing operations of principal parts of the FIG. 15 embodiment.

In each m-ary FSK modulator $5_i$, the signal switching means $4_i$ selects, in accordance with the symbol of the input signal $S_i$, one of the outputs from the oscillators whose frequencies are predetermined. In FIG. 16, A and B show, by way of example, the states of the input signal $S_i$ to the m-ary FSK modulator $5_i$ and the output frequency thereof. In this case, m=2 and the basic principles are the same also when m>2. In this way, the signal switching means $4_i$ switches the oscillation frequency to either one of fi−δf [Hz] and fi+δf [Hz] in accordance with the symbol of the input signal $S_i$. Here, the m-ary FSK signal is a mere tone signal except at the time of switching oscillation frequencies, and the multiplexed FSK signal can be regarded as a n multitone signal (or multi-frequency signal, i.e. MF signal). The peak envelope power (PEP) of the n multitone signal varies over a wide range in accordance with the combination of initial phases of respective tones. The peak envelope power PEP can be reduced by appropriately adjusting the initial phases of the respective tones of the multitone signal (refer to Narahashi and Nojima, "Peak-factor suppression effects of multi-carrier system with initial-phase assignment method," Spring National Convention Record of the Institute of Electronics, Information and Communication Engineers of Japan, B-388, 1990).

In accordance with the combination of oscillation frequencies which is dependent on the combination of symbols of the input signals to the n m-ary FSK modulators $5_i$, the control means 48 sets, as the phase shift amount for the variable phase shifter means $47_i$, an initial phase such that the peak envelope power PEP of the combined signal will not greatly exceed the average power level of the envelope but stay, for example, several-fold. When the multiplexing number of the m-ary FSK signal is n, the number of combinations of symbols is $m_n$. The control means 48 has a storage means 46 which has stored therein the phase shift amounts precalculated for all symbol combinations; at the timing when the oscillation frequency of the m-ary FSK modulator $5_i$ changes, that is, at the switching timing when the combination of n frequencies of the respective channels changes, the control means reads out the phase shift amount, corresponding to the combination of symbols of the input signals to the control input ports $49_i$ (where i=1 to n), from the storage means 46, and provides via the control output port $50_i$ a control signal which adjusts the phase shift amount of the variable phase shifter means $47_i$ on the basis of the read-out value. In other words, the control means adjusts the phase shift amounts of the variable phase shifter means $47_i$ in synchronization with the frequency switching of the output FSK signal from the m-ary FSK modulator $5_i$. For instance, if a voltage-controlled phase shifter is used as the variable phase shifter means $47_i$, a D/A converter is used to apply a control voltage to the control output port $50_i$. In FIG. 16, C is an example of the value set for the phase shift amount of the variable phase shifter means $47_i$.

With the above-described procedure, it is possible to prevent a substantial increase in the peak envelope power PEP of the multiplexed FSK modulated signal.

While the control operation described above is to set the phase shift amount of the variable phase shifter $47_i$ to a predetermined value according to the combinations of symbols of the input signals to the control input ports $49_i$ of the control means 48, it is also possible to employ a control scheme wherein the control means 48 sequentially calculates the phase shift amount and sets each variable phase shifter means $47_i$ to the calculated value. In this case, the control means 48 sequentially calculates the phase shift amount by use of a microprocessor or the like in accordance with the combination of symbols of the input signals to the control input ports $49_i$ (where i=1 to n) and applies a control signal to each variable phase shifter means $47_i$ via the control output port $50_i$.

The sequential calculation of the phase shift amount of the variable phase shifter means $47_i$ can be done in such a manner as described below. That is, letting the frequencies to be set in the n m-ary FSK modulation means $5_i$ in accordance with the symbols of the input signals be represented by $f_i$ (where i=1, ..., n), a complex envelope signal u(t) of a signal produced by multiplexing the output FSK signals of the n m-ary FSK modulating means $5_i$ is expressed by the following equation:

$$u(t) = \sum_{i=1}^{n} a \exp[j(2\pi f_i t + \theta_i)] \quad (5)$$

where a is the amplitude of each FSK signal and $\theta_i$ is the initial phase of an i-th one of the FSK modulated signals. Now, let the maximum value of the multiplexed signal in its one period T, which is determined by the combination $\{\theta_i\}$ of the initial phases, be represented by $A(\theta_1, \ldots, \theta_n)$.

$$A(\theta_1, \ldots, \theta_n) = \max|u(t)|, t[0,T) \quad (6)$$

The peak envelope power PEP of the multiplexed signal is proportional to the square value of $A(\theta_1, \ldots, \theta_n)$, and hence can be reduced by calculating a combination of initial phases $\{\theta'_i\}$ which reduces $A(\theta_1, \ldots, \theta_n)$ and then the variable phase shifter means $47_i$ for each FSK modulated signal is adjusted in accordance with $\{\theta'_i\}$.

A description will be given, with reference to a flowchart of FIG. 30, of an example of a method for calculating the combination of initial phases $\{\theta'_i\}$ which reduces $A(\theta_1, \ldots, \theta_n)$.

$A(\theta_1, \ldots, \theta_n)$ is calculated for each of a plurality ($M_O$) of predetermined combinations of initial phase and one of the combinations of initial phases which reduces $A(\theta_1, \ldots, \theta_n)$ is output as $\{\theta'_i\}$. The $M_O$ combinations of initial phases $\{\theta_i\}$ are generated, for example, by changing the initial phase $\theta_i$ (where i=1, ..., n) of the FSK modulated signals for each minimum phase step ($\Delta\theta$). Setting $\Delta\theta=2\pi/K$ (where K is an integer equal to or greater than 2). $M_O=K^n$ in case of taking into account all the combinations of initial phases.

In FIG. 30, the frequency $f_i$ of the FSK signal from each m-ary FSK modulation means $5_i$ is set according to the input signal (symbol) thereto ($S_1$), and the variable M representing the number of times the calculation has been conducted is initialized to zero and variable $A_{min}$ representing the minimum one of the calculated values $A(\theta_1, ..., \theta_n)$ is initialized to na (the maximum value of $A(\theta_1, ..., \theta_n))(S_2)$. The $M_O$ combinations of initial phases $\{\theta_i\}$ are each set in a predetermined sequential order ($S_3$), then $A(\theta_i, ..., \theta_n)$ is calculated for that combination of initial phases $\{\theta_i\}$ ($S_4$) and a check is made to see if the calculated $A(\theta_1, ..., \theta_n)$ is smaller than a predetermined value $A_{th}$ ($S_5$). If so, the combination of initial phase $\{\theta_i\}$ at that time is output as the combination of initial phases $\{\theta'_i\}$ which reduces $A(\theta_i, ..., \theta_n)$ ($S_6$), thereafter being set in each variable phase shifter means $17_i$ ($S_7$).

If it is found in step $S_5$ that $A(\theta_i, ..., \theta_n)$ is not smaller than the predetermined value $A_{th}$, then a check is made to determine whether $A(\theta_i, ..., \theta_n)$ is smaller than the variable $A_{min}$ ($S_8$); if smaller, $A(\theta_1, ..., \theta_n)$ is updated with the value $A_{min}$, then the combination of initial phase $\{\theta_i\}$ is output as the combination of initial phases $\{\theta'_i\}$ ($S_9$) and M is incremented by one ($S_{10}$).

If it is found in step $S_8$ that $A(\theta_1, ..., \theta_n)$ is not smaller than the value $A_{min}$, then the process proceeds to step $S_{10}$. After the variable M is incremented by one, a check is made to see if the variable M is equal to $M_O$ ($S_{11}$); if not, the process returns to step $S_3$, wherein the same calculations and processes as described above are carried out using the next combination of initial phases $\{\theta_i\}$. If $M = M_O$ in step $S_{11}$, then the combination of initial phases $\{\theta'_i\}$ at that time is set in each variable phase shifter means $17_i$ ($S_7$).

In the above, steps $S_5$ and $S_6$ may be omitted. In such an instance, from among the $M_O$ predetermined combinations of initial phases, $\{\theta_i\}$ that provides the minimum value of $A(\theta_1, ..., \theta_n)$ is selected and used as the combination of initial phases $\{\theta'_i\}$ and the phase shift amount of each variable shifter means $47_i$ is set accordingly.

In short, since the peak value of the multiplexed signal needs only to be not more than an allowable value, for example, equal to or less than 4 to 5 times the average power of the multiplexed signal itself, it is not always necessary to calculate the combination of initial phases $\{\theta'_i\}$ that minimizes the peak value of the multiplexed signal, on the basis of the combination of input symbols; the computational complexity could be reduced by using the value $A_{th}$ in step $S_5$ as the above-mentioned allowable value. From such a viewpoint, it will be understood that the number of calculations involved could be decreased by setting the initial phase $\theta_i$ (where i=1, ..., n) as random values which are uniformly distributed in [0, $2\pi$) in step $S_3$, instead of calculating $A(\theta_i, ..., \theta_n)$ for all the combination of phases that are generated by changing the initial phases $\{\theta_i\}$ with the minimum phase step $\Delta\theta=2\pi/K$ in [0, $2\pi$) and by setting the value $M_O$ to a number smaller than $K^n$.

Figure 3:
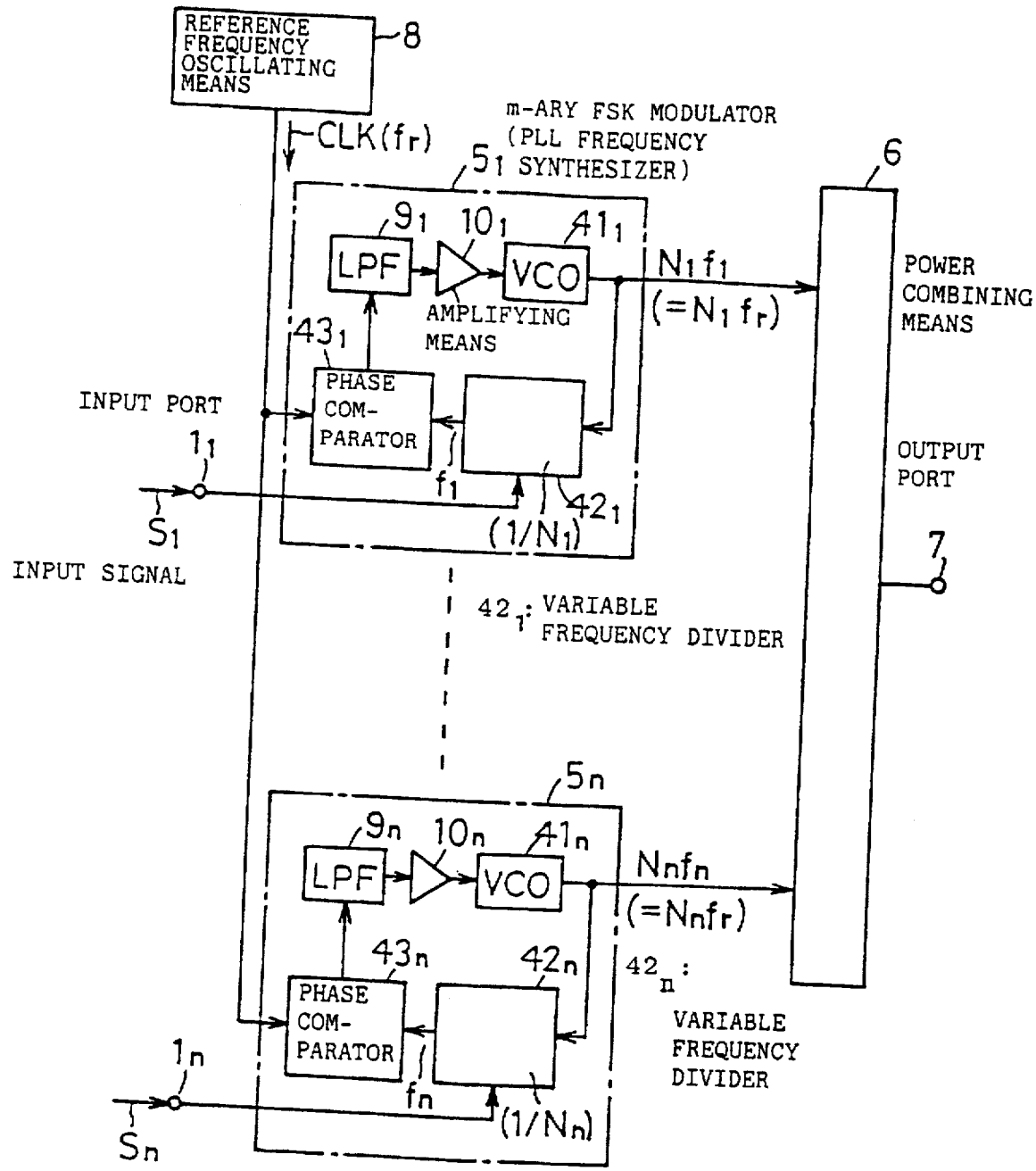
FIG. 3 is a block diagram illustrating a concrete example of the conventional FSK signal multiplexer.
Figure 4:
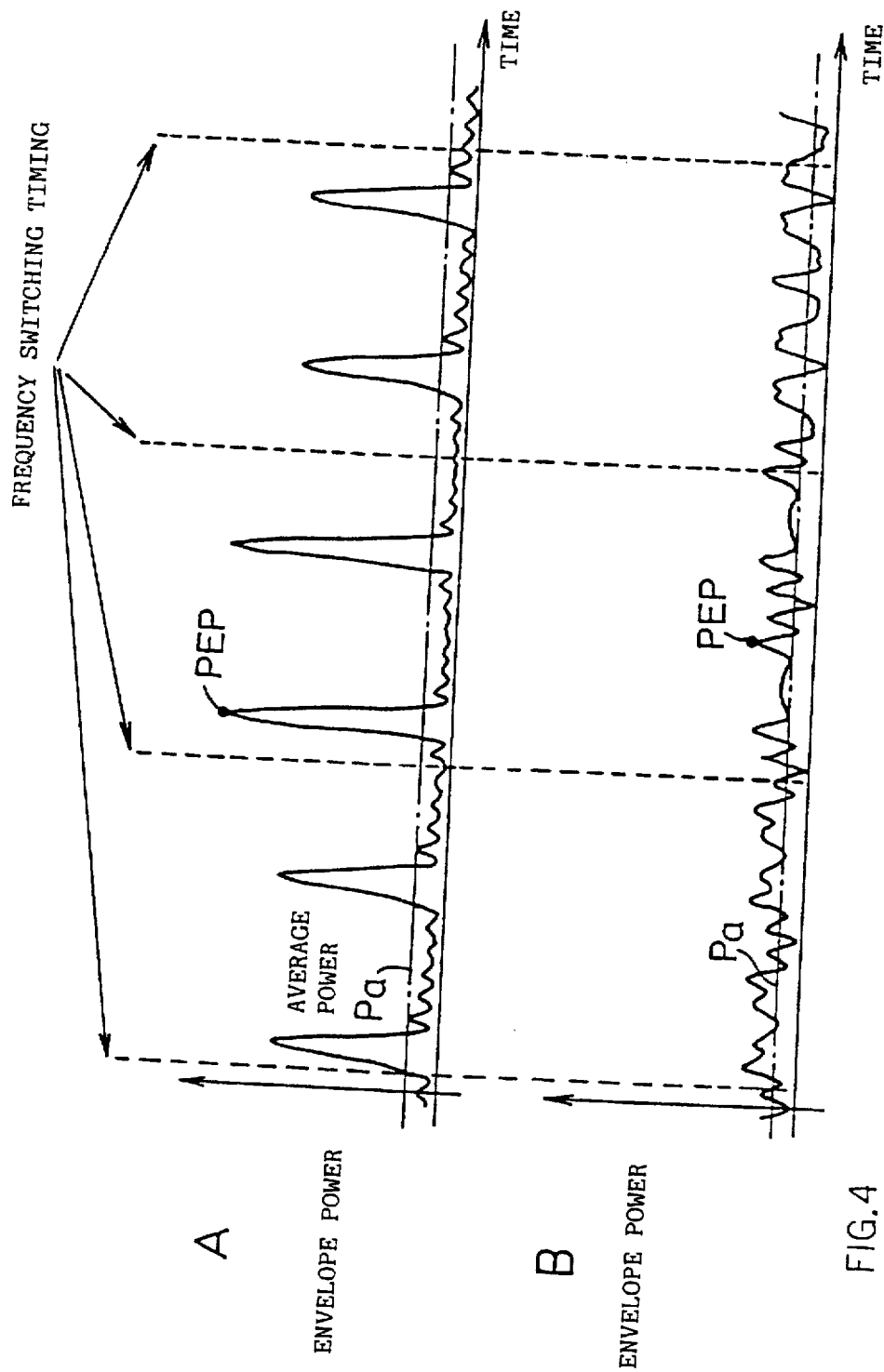
FIG. 4 is a diagram showing examples of envelope power waveforms of FSK multiplexed signals.
Figure 17:
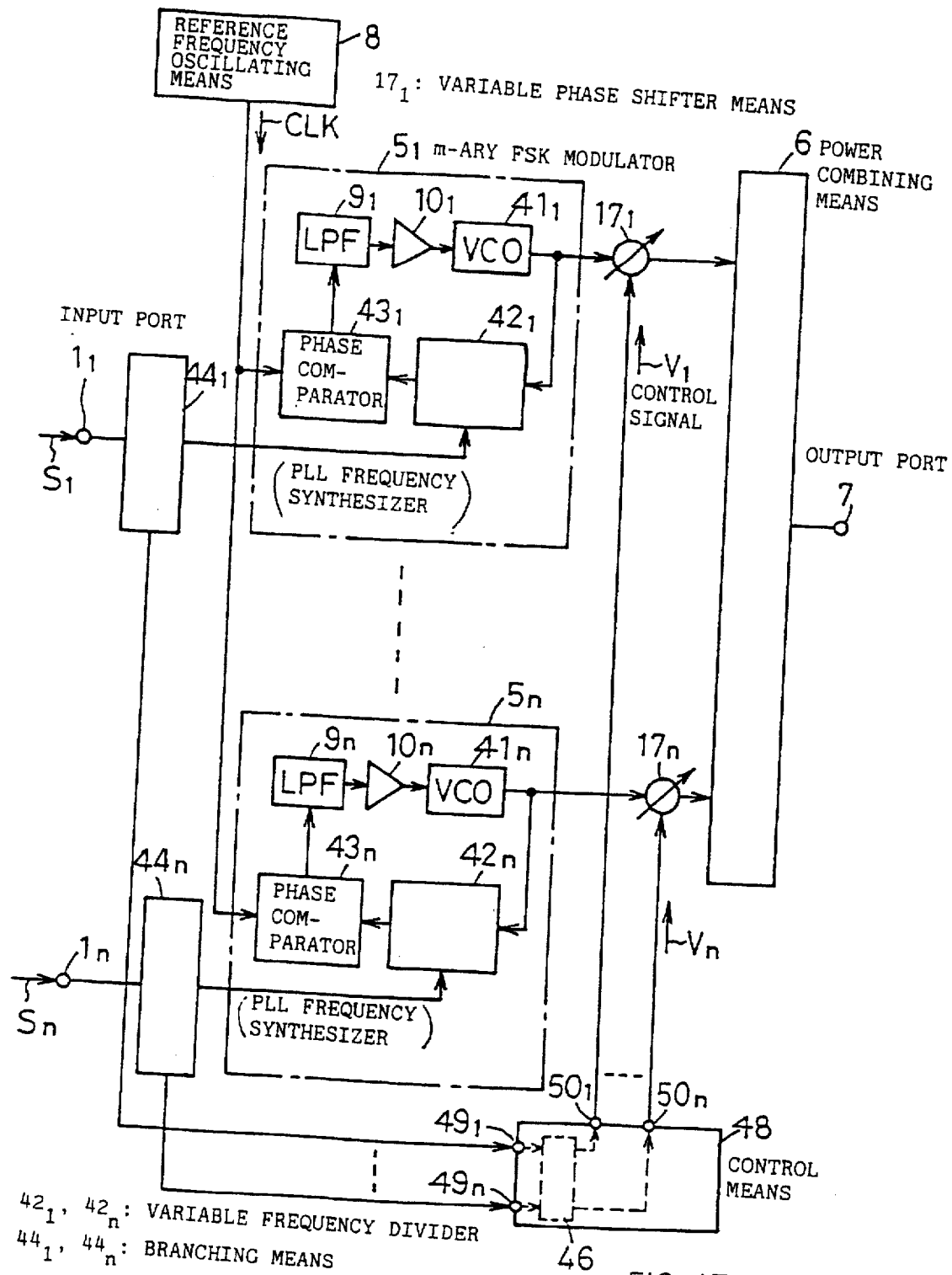
FIG. 17 is a block diagram illustrating an embodiment according to the seventh aspect of the invention which employs a PLL frequency synthesizer as an m-ary FSK modulator.

In FIG. 17 there is shown an example wherein each m-ary FSK modulator $5_i$ in the FIG. 15 embodiment is constructed by the PLL frequency synthesizer in FIG. 3, the parts corresponding to those in FIGS. 3 and 15 being identified by the same reference numerals.

Figure 18:
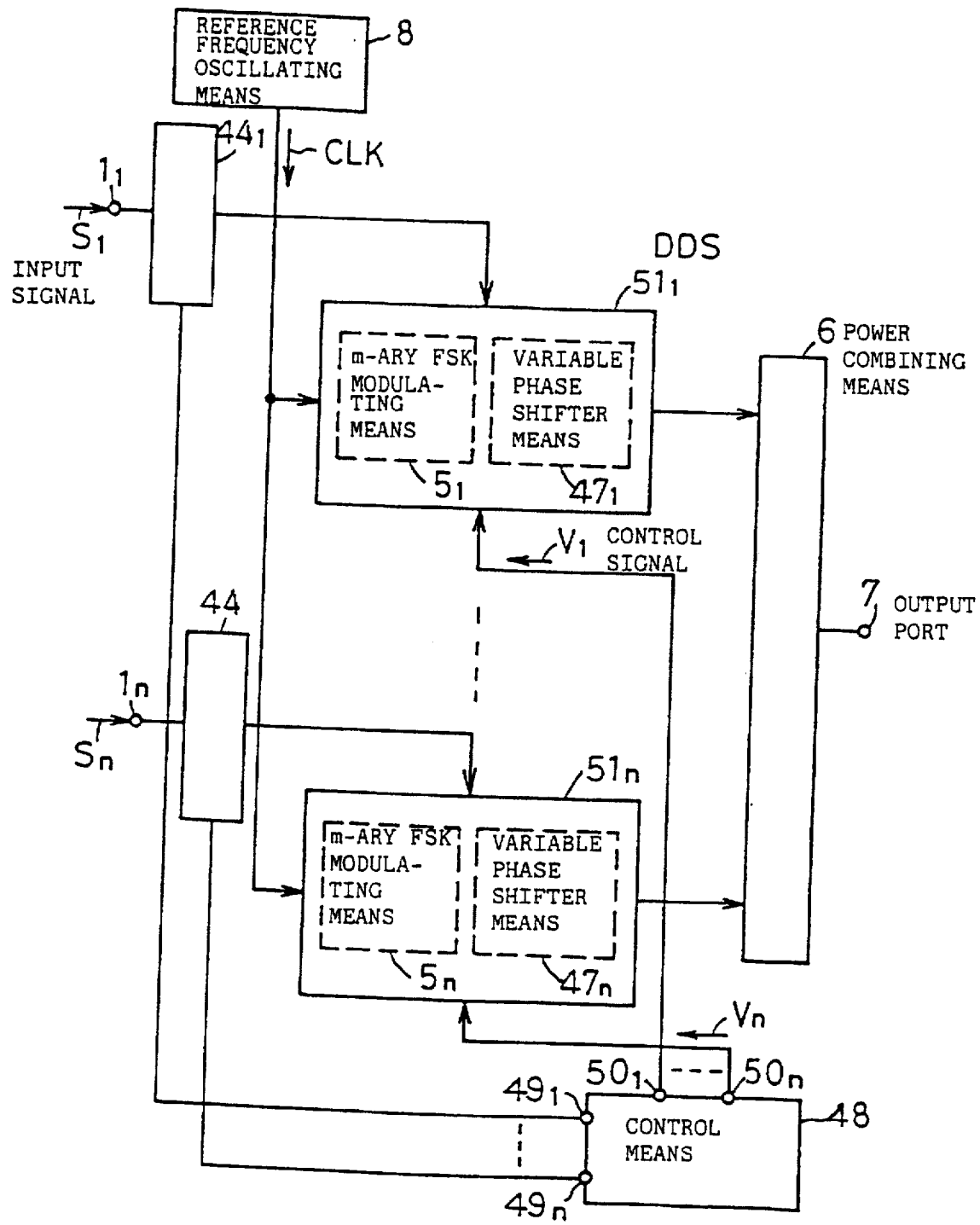
FIG. 18 is a block diagram illustrating another embodiment according to the seventh aspect of the invention which employs a direct digital frequency synthesizer DDS as the m-ary FSK modulator.
Figure 19:
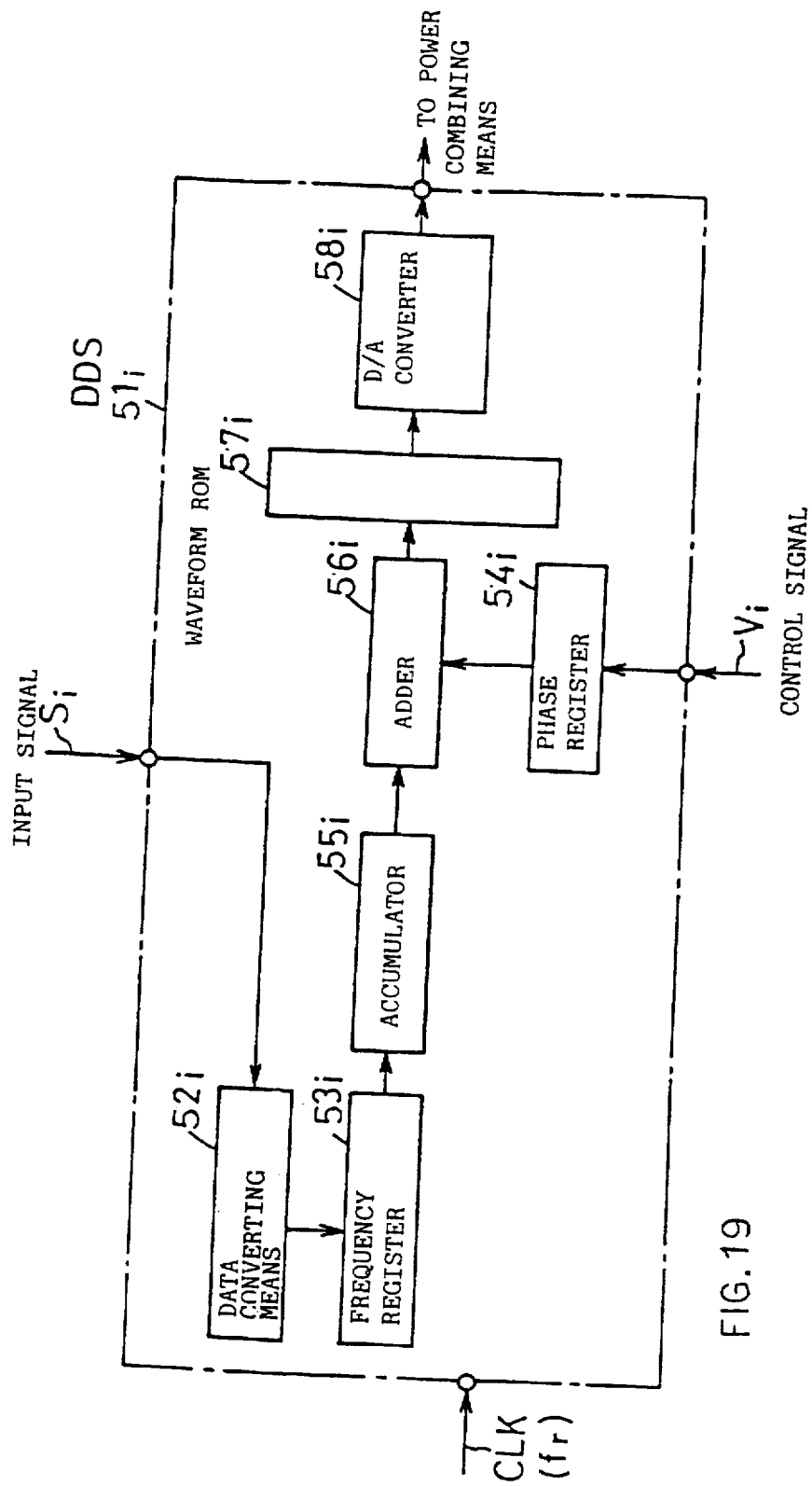
FIG. 19 is a block diagram illustrating an example of the basic configuration of the direct digital frequency synthesizer DDS.

FIG. 18 illustrates an example wherein the m-ary FSK modulator $5_i$ and the variable phase shifter means $47_i$ in FIG. 15 are constructed by a direct digital frequency synthesizer (DDS) $51_i$. In FIG. 19 there is shown an example of the basic configuration of the DDS $51_i$: in the DDS $51_i$: the input signal $S_i$ provided via the branching means $44_i$ is converted by data converting means $52_i$ into an oscillation frequency data value; the oscillation frequency data value from the data converting means $52_i$ is stored in a frequency register $53_i$; the oscillation frequency data value in the frequency register $53_i$ is accumulated by an accumulator $55_i$; the accumulated value is added by an adder $56_i$ to an initial phase data value from a phase register $54_i$; and the added data value is used to read out data from a waveform ROM $57_i$; and the read-out data is converted by and D/A converter $58_i$ into an analog signal for output. The direct digital frequency synthesizer DDS is supplied with the reference frequency signal CLK, by which the accumulating operation of the accumulator $55_i$ and the read-put operation of the waveform ROM $57_i$ are conducted, the oscillation frequency data value is switched in accordance with the input signal $S_i$ to set the frequency of the FSK signal to be output, and data corresponding to the control signal $V_i$ is set in the phase register $54_i$ to thereby set the phases of the FSK signal to be output from the DDS $51_i$. The FIG. 18 embodiment is identical in construction with the FIG. 15 embodiment except for the above.

Figure 20:
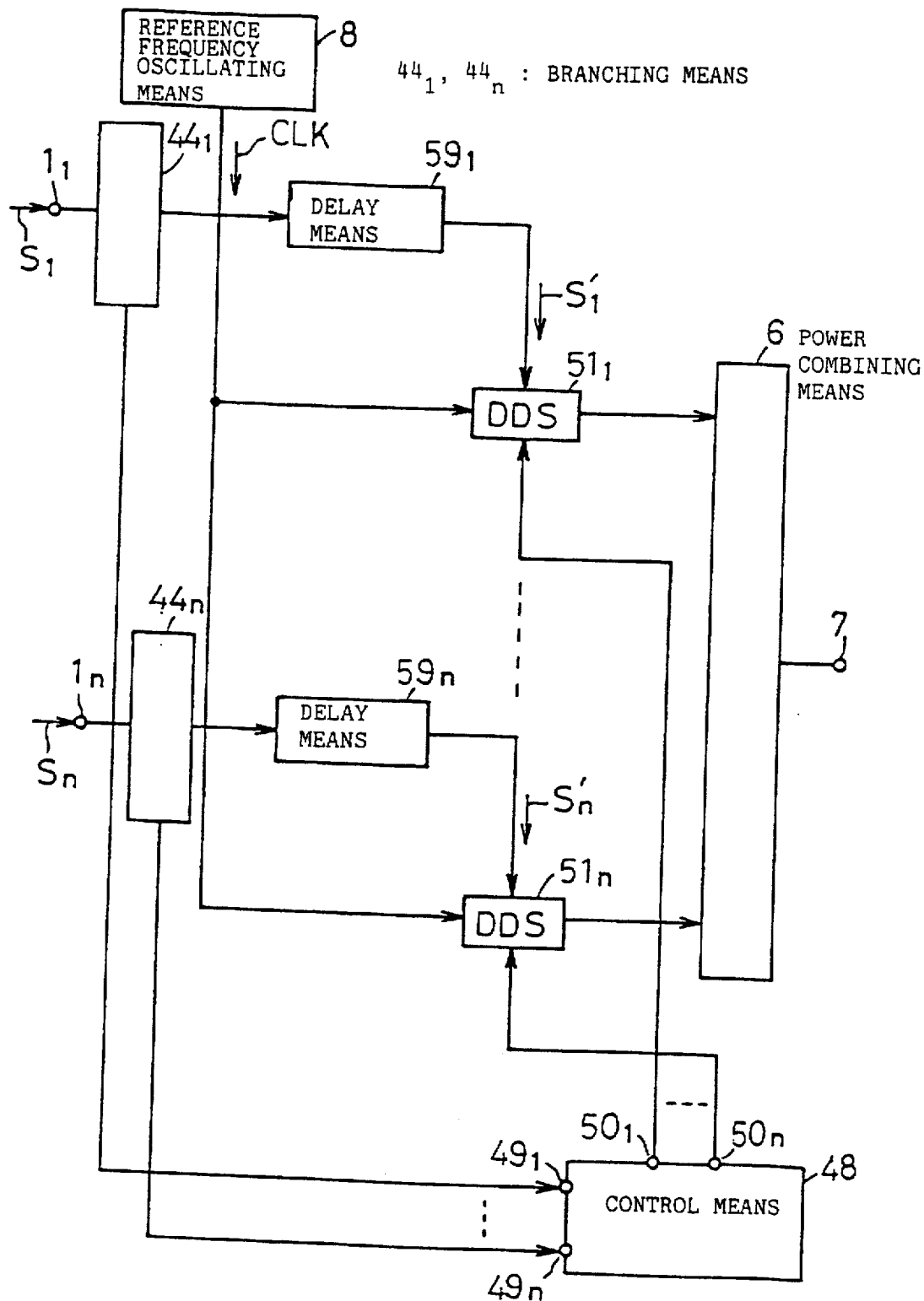
FIG. 20 is a block diagram illustrating another embodiment according to the seventh aspect of the invention.

It is also possible to employ relatively low-speed and low-cost variable phase shifter means $47_i$ and control means 48 through utilization of such an arrangement as shown in FIG. 20, wherein delay means $59_i$ is connected in series between each branching means $44_i$ and the DDS $51_i$ (or m-ary FSK modulator $5_i$) so that the inputting of the input signal $S_i$ to the DDS $51_i$ (or m-ary FSK modulator $5_i$) is delayed behind the input to the control means 48.

Figure 21:
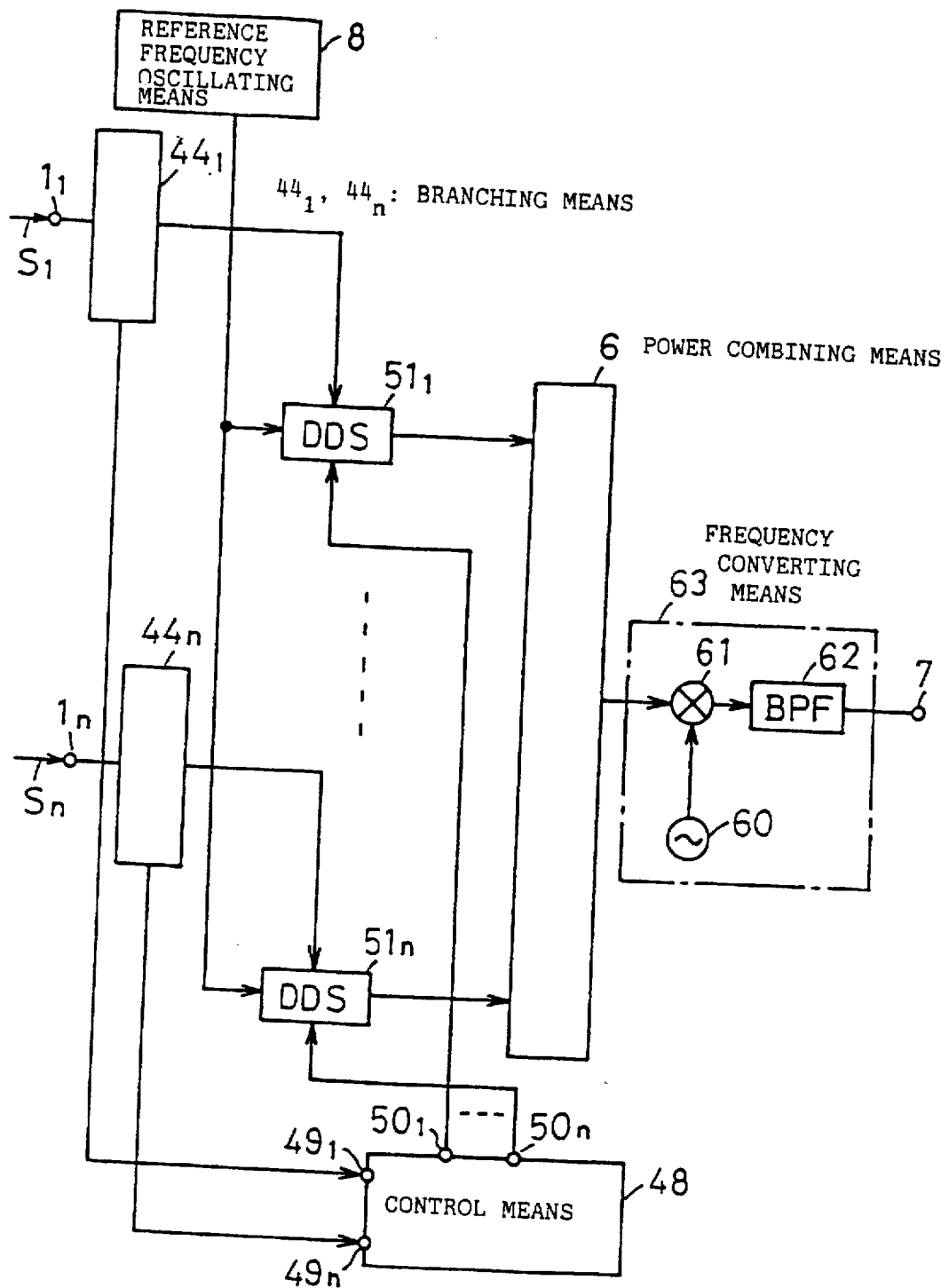
FIG. 21 is a block diagram illustrating another embodiment according to the seventh aspect of the invention.

As shown in FIG. 21, frequency converting means 63 may be provided at the output side of the power combining means 6 so that the multiplexed signal from the power combining means 6 is converted by the frequency converting means 63 to a signal of a higher frequency band. The frequency converting means 63 is made up of a local oscillator 60, a mixer 61 for multiplying output signals from the local oscillator 60 and the power combining means 6, and band-pass filter means 62 provided at the output side of the mixer 61 to remove signals of unnecessary frequency bands resulting from the multiplication.

Figure 22:
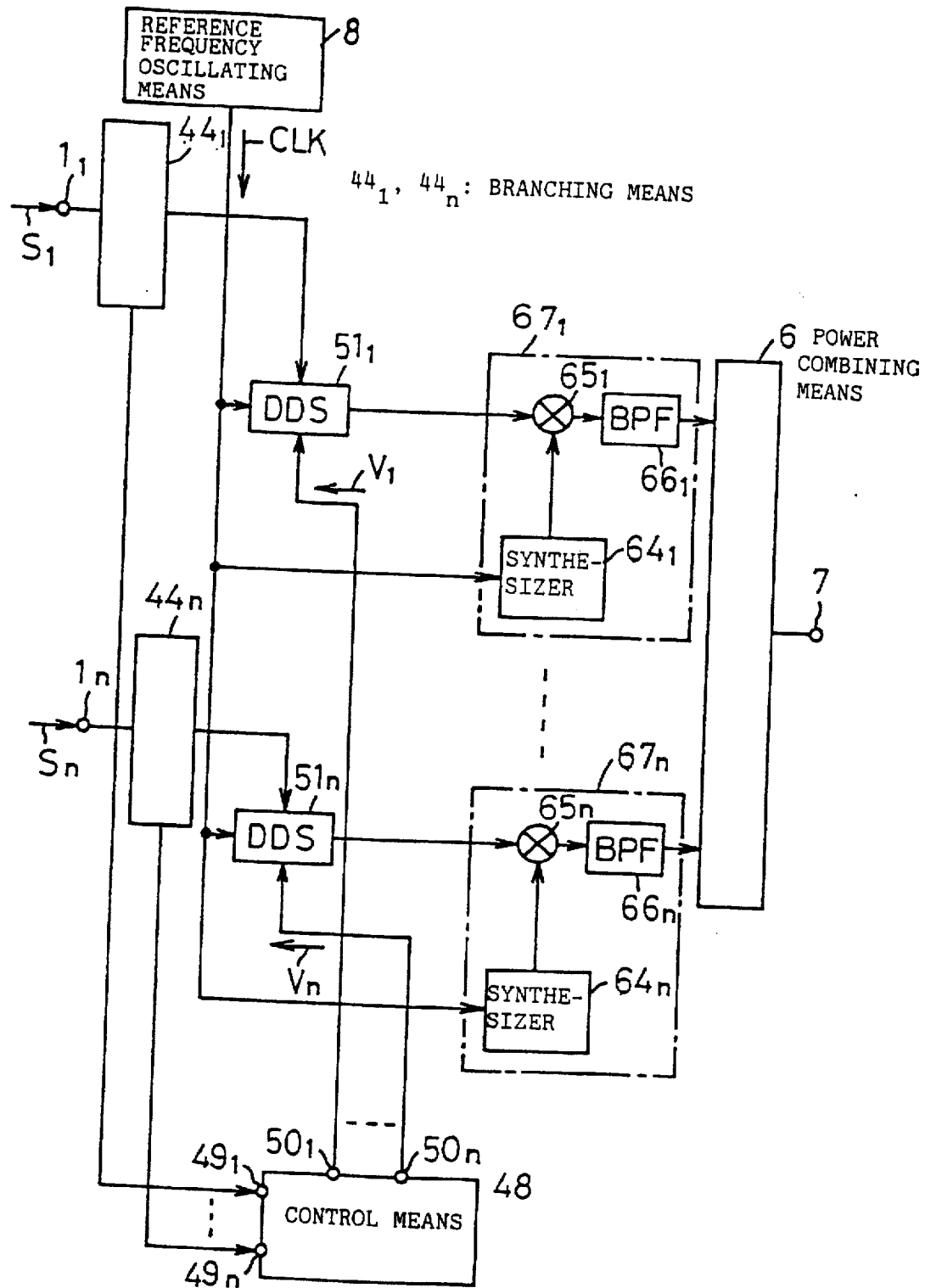
FIG. 22 is a block diagram illustrating another embodiment according to the seventh aspect of the invention.

In FIG. 22, frequency converting means $67_i$ is provided in the output path of each DDS $51_i$, and the outputs from the direct digital frequency synthesizers $51_1$ to $51_n$ are converted into high-frequency signals of different frequency bands, thereafter being fed to the power combining means 6. In this instance, the center frequency (the carrier frequency) of the output from the DDS $51_i$ or m-ary FSK modulator $5_i$ in each channel can be set to a relatively low fixed value—this facilitates the designing of these circuits including the variable phase shifter means and permits the use of inexpensive parts. In the frequency converting means $67_i$, the output signal from a frequency synthesizer $64_i$, which uses the output from the reference frequency oscillating means 8 as a reference frequency signal, is multiplied by the output signal from the DDS $51_i$ in a mixer $65_i$, and the multiplied output is fed to the power combining means via band-pass filter means $66_i$ wherein signals of unnecessary frequency bands resulting from the multiplication are eliminated.

Figure 23:
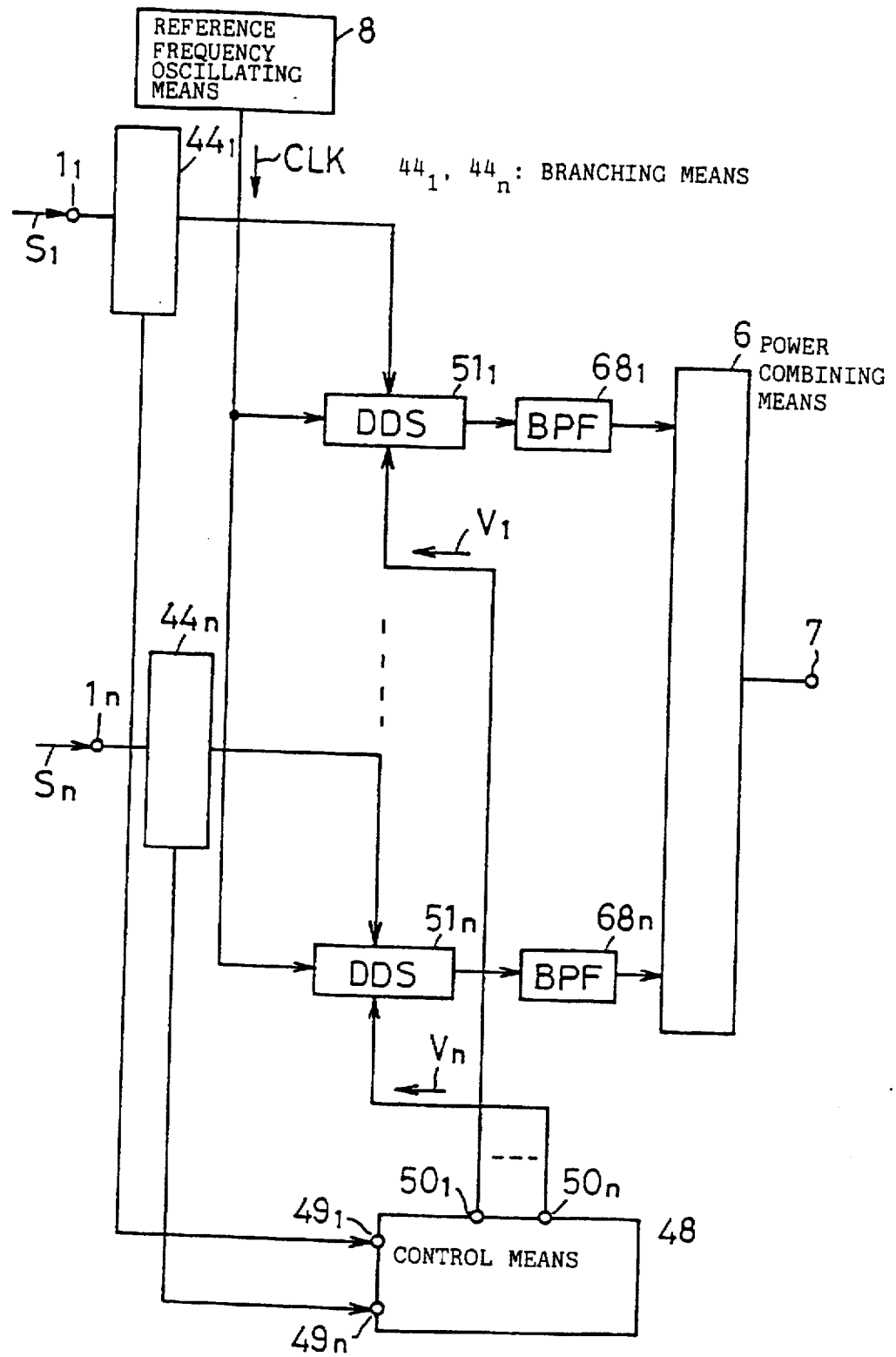
FIG. 23 is a block diagram illustrating another embodiment according to the seventh aspect of the invention.

FIG. 23 illustrates an example in which there is provided at the output side of each DDS $51_i$ band-pass filter means $68_i$, which permits the passage therethrough of its output FSK modulated signal, and outputs from such band-pass filter means $68_i$ are combined by the power combining means 6. With the aforementioned m-ary FSK modulated signal generation method by switching the output signals from a plurality of oscillating means (FIG. 15), the phase of the m-ary FSK modulated signal usually becomes discontinuous at the time of switching the oscillation frequency. Also with the method employing the PLL frequency synthesizers (FIG. 17), similar phase discontinuity occurs when a sharp phase shift is done by the variable phase shifter means $47_i$. This causes spreading of the spectrum of the output m-ary FSK modulated signal. The band-pass filter means $68_i$ is used to suppress the spreading of the spectrum. The power-combined output of the modulated signals, with the spreading of their spectra thus suppressed in the respective channels, may be converted by the frequency converting means 63 to a high-frequency band signal as depicted in FIG. 21. That is to say, the configurations shown in FIGS. 21 and 23 may preferably be combined.

Figure 24:
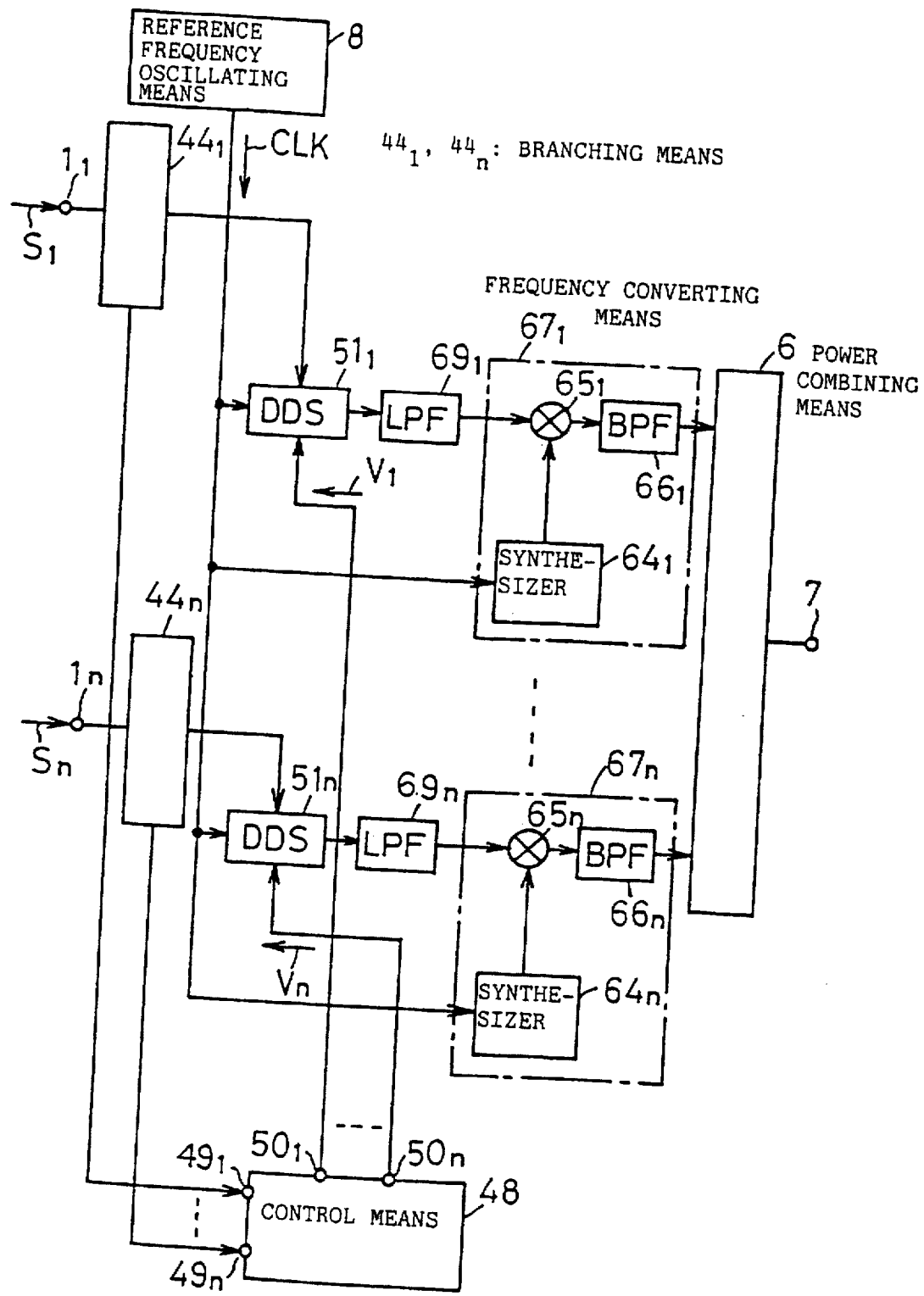
FIG. 24 is a block diagram illustrating another embodiment according to the seventh aspect of the invention.

As shown in FIG. 24, low-pass filter means $69_i$ may be provided between each DDS $51_i$ and the frequency converting means $67_i$ in FIG. 22. The low-pass filter means $69_i$ is intended to suppress the spreading of the spectrum as is the case with the band-pass filter means $68_i$ in the FIG. 23 embodiment.

In FIG. 21, the same effect could be also produced by connecting the low-pass filter means $69_i$ to the input side of the power combining means 6.

Figure 25:
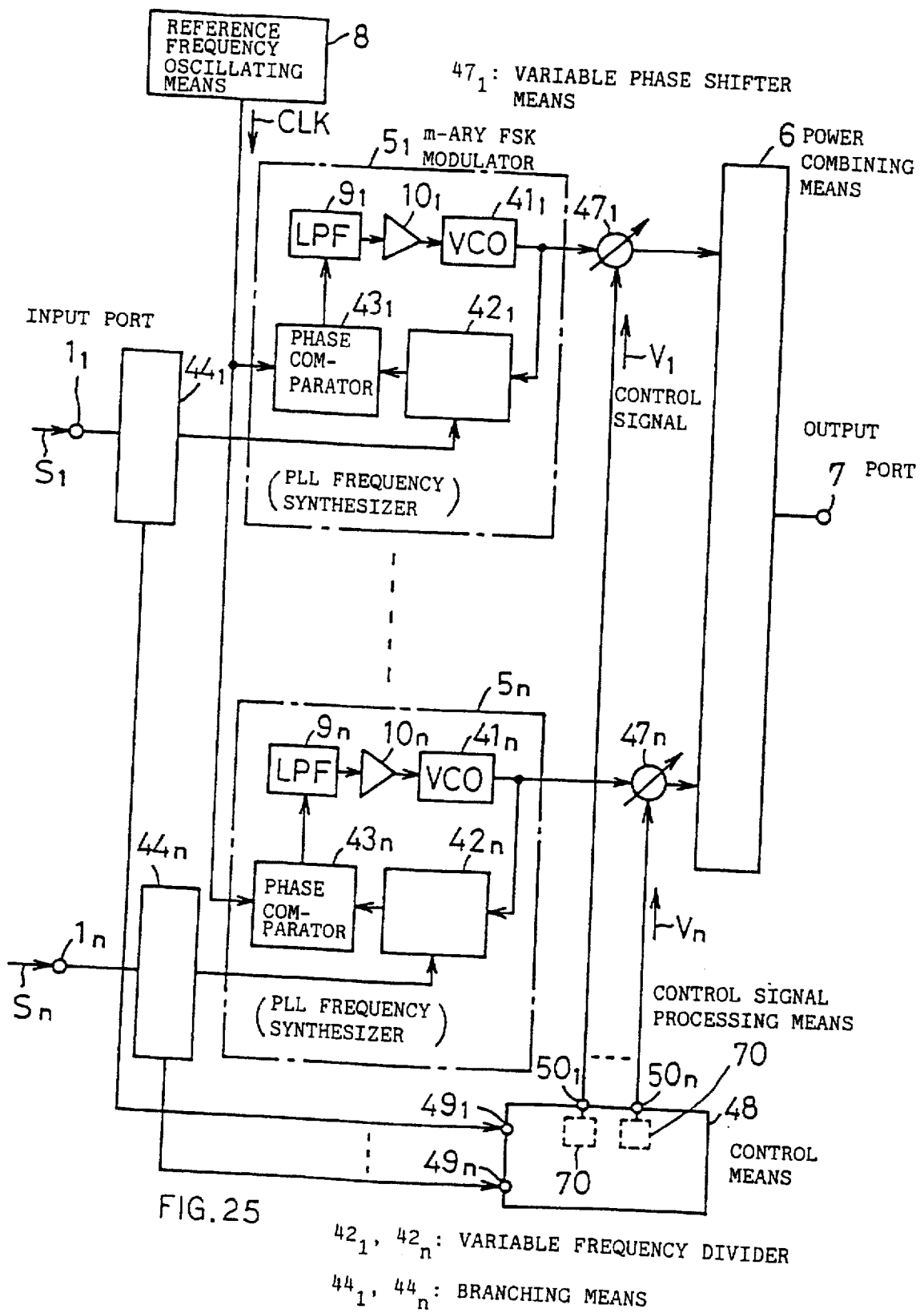
FIG. 25 is a block diagram illustrating another embodiment according to the seventh aspect of the invention.

As depicted in FIG. 25, control signal processing means 70 is provided in the control means 48 in FIG. 17, by which the control signal for setting the phase shift amount of the variable phase shifter means $47_i$ is so processed as to suppress the spreading of the spectrum of the output m-ary FSK modulated signal, and the thus processed control signal is provided to the control output port $50_i$. For example, if a voltage-controlled phase shifter is used as the variable phase shifter means $47_i$, phase shift amount data, read out in accordance with the combination of symbols of the input signals to each control input port $49_i$, is converted by a D/A converter to an analog voltage, which is provided to the control output port $50_i$ after being processed by a low-pass filter so that the phase shift amount of the variable phase shifter means $50_i$ does not vary stepwise. In FIG. 16D there is shown, comparing with an example which performs no filter processing of the control voltage (FIG. 16C), a waveform of the phase control signal $V_i$ which is processed to inhibit the spreading of the spectrum of the m-ary FSK modulated signal. If the m-ary FSK modulated signal multiplexer is constructed by using the DDS $51_i$, the phase of the m-ary FSK modulated signal from the DDS $51_i$ could be made continuous by processing the data from the control output port $50_i$ to the phase register $54_i$ (FIG. 19) with the control signal processing means 70. Incidentally, the same effect can be obtained regardless of whether the control signal processing means 70 is disposed inside or outside of the control means 48.

Figure 26:
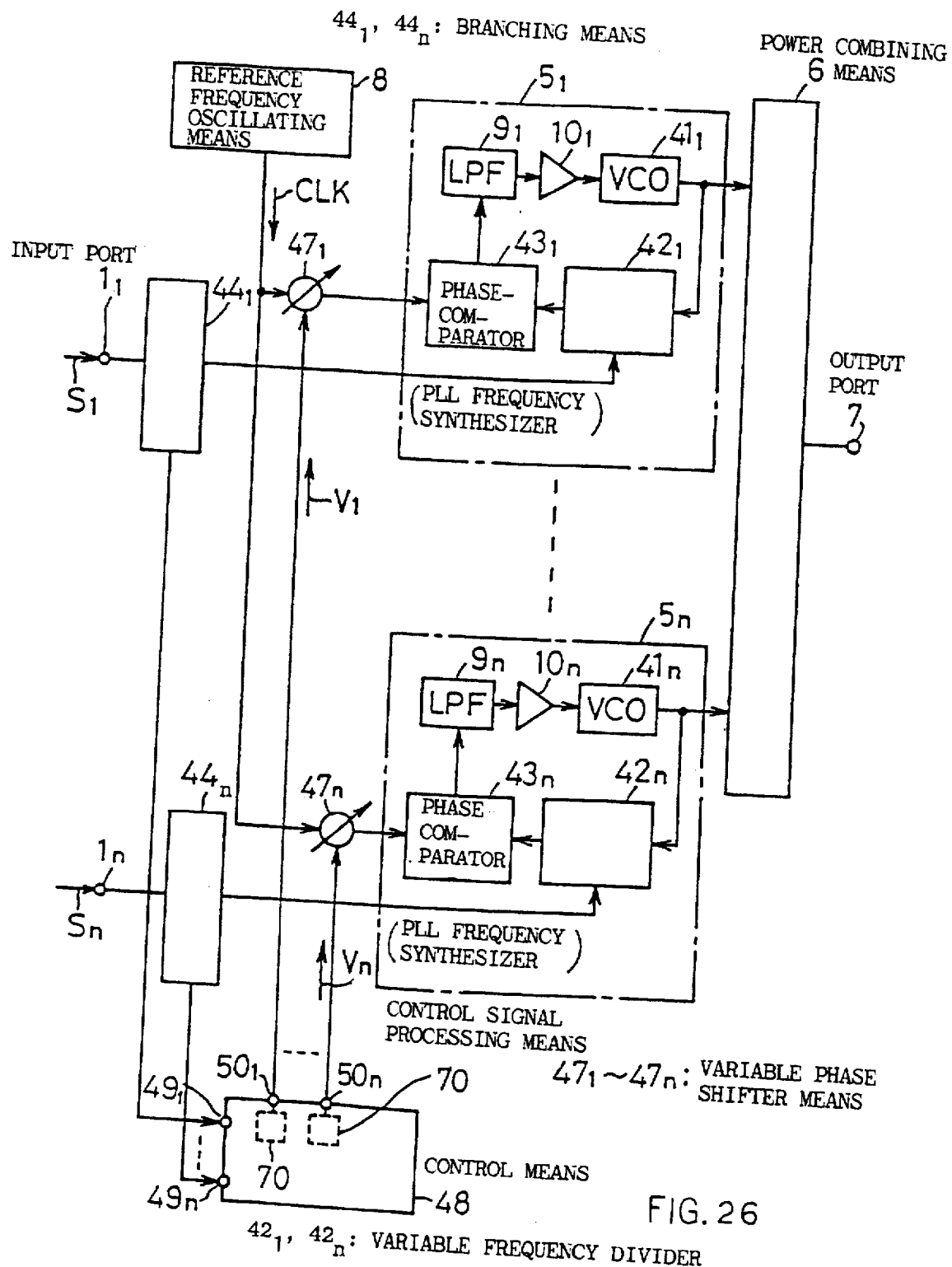
FIG. 26 is a block diagram illustrating another embodiment according to the seventh aspect of the invention.

In the above embodiments employing the variable phase shifter means $47_i$, their positions are not limited specifically to those shown; they may be disposed at any other position as long as the phase of each m-ary FSK modulated signal can be adjusted. FIG. 26 illustrates an embodiment in which the variable phase shifter means $47_i$ is provided in the path over which the reference frequency signal from the reference frequency oscillating means 8 is fed to each m-ary FSK modulator $5_i$. This embodiment is identical in construction with the FIG. 25 embodiment except for the above. Also in this case, the phase of each m-ary FSK modulated signal can be adjusted by adjusting the phase shift amount of the variable phase shifter $47_i$ because the output signal from the m-ary FSK modulator $5_i$ is synchronized with the reference signal CLK from the reference frequency oscillating means 8.

Incidentally, the part indicated by the DDS $51_i$ in the above embodiments may be replaced with such an m-ary FSK modulator $5_i$ and variable phase shifter means $47_i$ as shown in FIG. 17.

Figure 27:
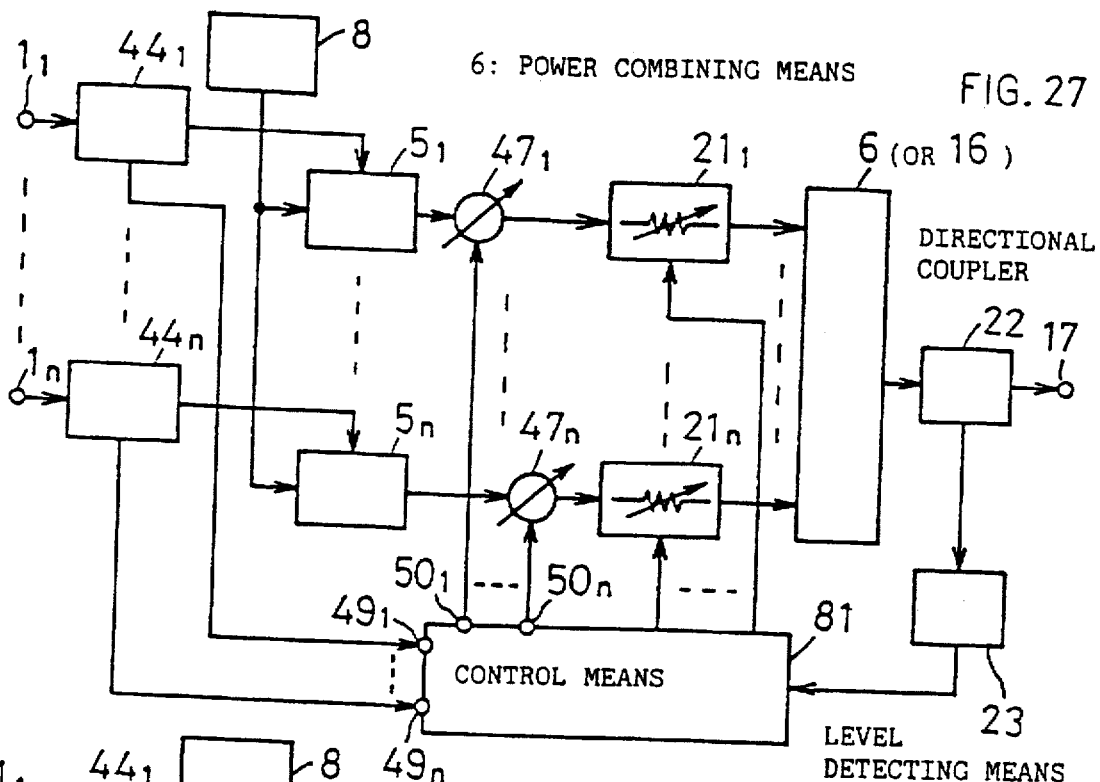
FIG. 27 is a block diagram illustrating another embodiment according to the seventh aspect which is combined with the first aspect of the invention.
Figure 28:
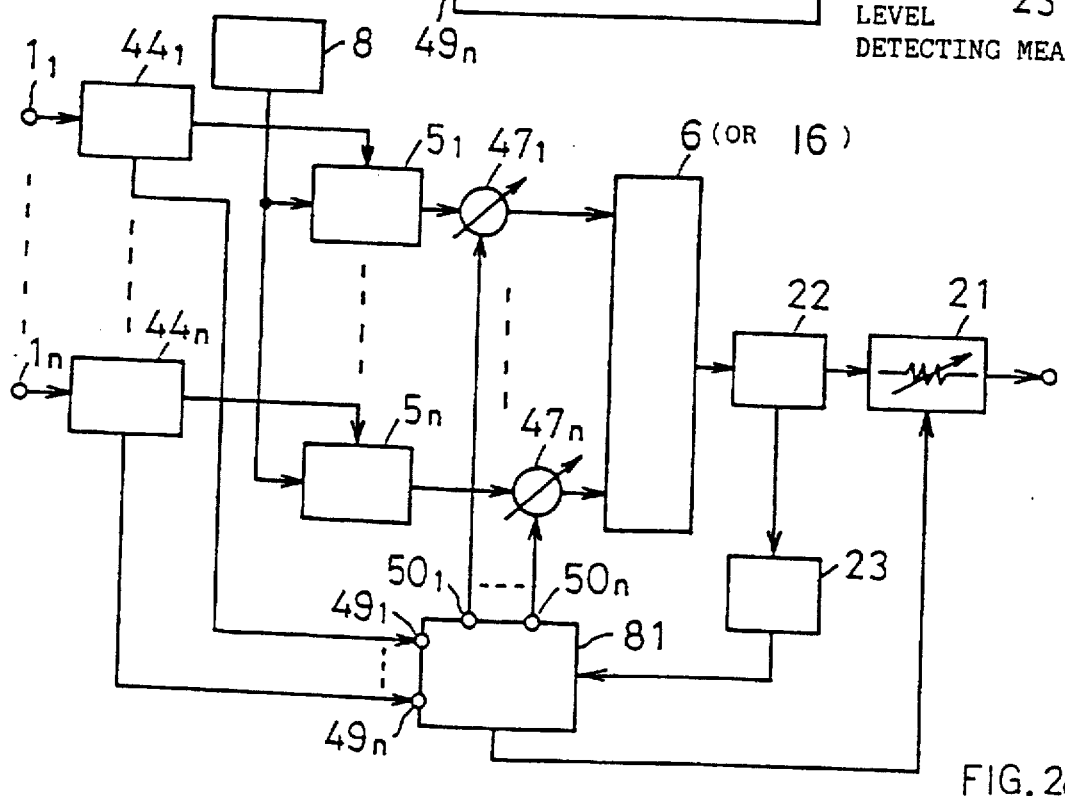
FIG. 28 is a block diagram illustrating still another embodiment according to the seventh aspect which is combined with the second aspect of the invention.

While as shown in FIGS. 15 to 26 the phase shift amount in each channel is controlled in accordance with the combination of symbols of input signals to prevent a substantial increase in the peak envelope power of the multiplexed m-ary FSK modulated signal, the configuration therefor can also be used in combination with the configuration that suppresses the peak envelope power by providing the attenuation as described previously with respect to FIGS. 5 to 12. The basic configurations are shown in FIGS. 27 and 28, in which the parts corresponding to those in FIGS. 5 to 26 are identified by the same reference numerals. In FIG. 27 the variable attenuators $21_1$ to $21_n$ are connected in series to the output sides of the m-ary FSK modulators $5_1$ to $5_n$, respectively, the control of the variable attenuators $22_1$ to $21_n$ based upon the envelope power level detected by the level detecting means 6 and the control for the variable phase shifter means $47_1$ to $47_n$ are effected by common control means 81. In FIG. 28 the variable attenuating means 21 is connected in series to the output side of the power combining means 6 (or 16), the envelope power level of the output multiplexed signal from the power combining means 6 is detected by the level detecting means 23. The variable attenuating means 21 and the variable phase shifter means $47_i$ to $47_n$ are placed under the control of the control means 81. In FIGS. 27 and 28 it is also possible to construct the m-ary FSK modulator $5_i$ and the variable phase shifter means $47_i$ by the DDS $51_i$ as mentioned previously and convert the signal to a high-frequency band at the input or output side of the power combining means 6; furthermore, the modifications and variations described previously in respect of FIGS. 15 to 26 can be applied to the embodiments of FIGS. 27 and 28.

As described above, according to the first to sixth aspects of the present invention, it is possible to suppress a large peak envelope power level of the multiplexed signal. In addition, since the signal is attenuated for only a predetermined period of time, that is, since the signal is attenuated only to such an extent as the width of an instantaneous peak value, the information contained in the modulated signal only undergoes an instantaneous distortion, and hence is not seriously affected.

In the case where attenuation is provided only when the number of times or the period of time the envelope power level continuously exceeds a predetermined level reaches a predetermined value, no attenuation control is effected when the amplifier at the preceding stage will not be greatly affected even if the envelope power level is higher than the predetermined level. Hence, the information contained in the modulated signal is less distorted accordingly.

In case of the device configuration wherein modulated signals are divided into those to be attenuated and those not, the peak of the envelope power is suppressed but some of the modulated signals (channels) are entirely free from the influence of the suppression on the channels where the requirement about the error rate is severe can be lessened as compared with the influence of uniform attenuation in all channels.

According to the seventh aspect of the present invention, the peak envelope power level of the multiplexed signal can be sufficiently lowered by controlling the phase shift amount of each m-ary FSK modulated signal in synchronization with a change in the symbol of the input and by effecting the control for each channel in accordance with the symbol state of each input signal. Furthermore, the application of the first or second aspect to the ninth one of the present invention ensures sufficient suppression of the peak envelope power of the multiplexed signal.

We claim:

1. A signal multiplexer wherein modulated signals of different frequency bands fed via n input channels are combined by power combining means to a multiplexed signal for output to an output port, n being an integer equal to or greater than 2, said signal multiplexer comprising:

m' variable attenuating means connected in series to an input port of said power combining means in association with m' ones of said n input channels, where m'≦n;

envelope power level detecting means for detecting the envelope power level of said multiplexed signal; and control means for setting predetermined attenuation amount in m ones of said variable attenuating means for a predetermined period of time when said detected envelope power level exceeded a predetermined level, where m≦m'.

2. The signal multiplexer of claim 1, wherein said predetermined attenuation amount set in said attenuating means is the same.

3. The signal multiplexer of claim 2, wherein said m is n, said predetermined level is k times the average power of said multiplexed signal, k being substantially in the range of 1 to 10, and said predetermined attenuation amount is equal to or more than 10 log (k/n). [db].

4. The signal multiplexer of claim 1, wherein said predetermined level is k times the average power of said multiplexed signal, k being substantially in the range of 1 to 10, m<n, (n−m) is set to a value equal to or smaller than the maximum integer not greater than $\sqrt{kn}$, attenuation amount of (n−m) ones of said variable attenuating means in which said predetermined attenuation amount is not set is set to zero, and said predetermined attenuation amount of m variable attenuating means other than said (n−m) ones is set to infinity.

5. The signal multiplexer of claim 1, wherein m<n, and further comprising:

switching means whereby said variable attenuating means in which said predetermined attenuation amount is set and said variable attenuating means in which said predetermined attenuation amount is not set are switched each time when said attenuation amount is set once or more times.

6. The signal multiplexer of claim 5, wherein said switching means is means for randomly selecting m ones of said variable attenuating means among n ones of said variable attenuating means.

7. The signal multiplexer of claim 5, wherein said predetermined level is k times the average power of said multiplexed signal, k being substantially in the range of 1 to 10, (n−m) is set to a value equal to or smaller than the maximum integer not greater than $\sqrt{kn}$, attenuation amount of (n−m) ones of said variable attenuating means in which said predetermined attenuation amount is not set is set to zero, and said predetermined attenuation amount of m variable attenuating means other than said (n−m) ones is set to infinity.

8. The signal multiplexer of claim 1, wherein some of said predetermined attenuation amounts are different from others in said variable attenuating means.

9. The signal multiplexer of claim 1, wherein said predetermined level is k times the average power of said multiplexed signal, k being substantially in the range of 1 to 10.

10. A signal multiplexer wherein modulated signals of different frequency bands fed via n input channels are combined by power combining means to a multiplexed signal for output to an output port, n being an integer equal to or greater than 2, said signal multiplexer comprising:

variable attenuating means connected in series between said power combining means and said output port;

envelope power level detecting means for detecting the envelope power level of said multiplexed signal; and control means for setting predetermined attenuation amount in said variable attenuating means for a predetermined period of time when said detected envelope power level exceeds a predetermined level which is k times the average power of said multiplexed signal, k being substantially in the range of 1 to 10.

11. The signal multiplexer of any one of claims 1 to 10, wherein said predetermined period of time is about $T_p=1/\Delta F_0$ (sec), $\Delta F_0$ [Hz] being the bandwidth of said multiplexed signal.

12. The signal multiplexer of any one of claims 1 to 10, wherein said control means is means for setting said predetermined attenuation amount when said detected envelope power level continuously exceeds said predetermined level more than a predetermined number of times.

13. The signal multiplexer of claim 12, wherein said predetermined period of time is about $T_p=1/\Delta F_0$ (sec), $\Delta F_0$[Hz] being the bandwidth of said multiplexed signal.

14. The signal multiplexer of any one of claims 1 to 10, wherein said predetermined control means is means for setting said attenuation amount when said detected envelope power level continuously exceeds said predetermined level for longer than a predetermined period of time.

15. The signal multiplexer of claim 14, wherein said predetermined period of time is about $T_p=1/\Delta F_0$ (sec), $\Delta F_0$ [Hz] being the bandwidth of said multiplexed signal.

16. A signal multiplexer wherein modulated signals of different frequency bands fed via n input channels are combined by power combining means to a multiplexed signal for output to an output port, n being an integer equal to or greater than 2 comprising:

n variable attenuating means connected in series to input ports of said power combining means in respective input channels;

envelope power detecting means for detecting the envelope power level of said multiplexed signal;

average power detecting means for detecting the average power of said multiplexed signal; and control means for setting predetermined attenuation amount in m ones of said variable attenuating means for a predetermined period of time when the ratio of said detected envelope power level to said detected average power exceeds a predetermined value, where m≦n.

17. A signal multiplexing method wherein modulated signals of different frequencies fed via n input channels are combined to a multiplexed signal for output, n being an integer equal to or greater than 2, said method comprising the steps of:

detecting the envelope power level of said multiplexed signal;

comparing said detected envelope power level with a predetermined level; and providing predetermined attenuation amount to m ones of said n modulated signal for a predetermined period of time when said detected envelope power level is higher than said predetermined level, where m≦n.

18. The signal multiplexing method of claim 17, wherein said m is smaller than n, and further comprising a step of changing the combination of m modulated signals to be attenuated each time when said predetermined attenuation amount is provided.

19. A signal multiplexing method wherein modulated signals of different frequencies fed via n input channels are combined to a multiplexed signal for output, n being an integer equal to or greater than 2, said method comprising the steps of:

detecting the envelope power level of said multiplexed signal;

comparing said detected envelope power level with a predetermined level; and providing predetermined attenuation amount to said multiplexed signal for a predetermined period of time when said detected envelope power level is higher than said predetermined level.

20. The signal multiplexing method of any one of claims 17 to 19, wherein said step of providing predetermined attenuation amount comprises the steps of:

incrementing a count value by one when said detected envelope power level is higher than said predetermined level; making a check to determine if said incremented count value reaches a predetermined value and, if so, causing the provision of said predetermined attenuation amount to be executed and, if not, returning to said envelope power level detecting step; and resetting said count value to zero and returning to said envelope power level detecting step if said detected envelope power level is lower than said predetermined level.

21. The signal multiplexing method of any one of claims 17 to 19, wherein said step of providing predetermined attenuation amount comprises the steps of:

beginning the counting of time if said detected envelope power level is higher than said predetermined level;

making a check to determine if said time count reaches a predetermined value and, if so, causing the provision of said predetermined attenuation amount to be executed and, if not, returning to said envelope power level detecting step; and resetting said time count value to zero and returning to said envelope power level detecting step if said detected envelope power level is lower than said predetermined level.

22. A signal multiplexer wherein n m-ary FSK modulating means for shifting their output frequencies in accordance with the symbols of input signals thereto are supplied with a common reference frequency signal from reference frequency oscillating means as the reference for the frequency of the output signal from each of said m-ary FSK modulating means and said output signals are combined by power combining means for output, where m and n are integers each equal to or greater than 2, said signal multiplexer comprising:

variable phase shifter means for shifting the phases of the output modulated signals from said m-ary FSK modulating means; and control means for setting the phase shift amounts of said phase shifter means to reduce the peak envelope power of the output from said power combining means, in accordance with a combination of symbols of said n input signals in synchronization with the timing for said m-ary FSK modulating means to switch their output frequencies according to the input signals thereto.

23. The signal multiplexer of claim 22, wherein said m-ary FSK modulating means each comprise m oscillators of different oscillation frequencies, and signal switching means for selectively outputting the oscillation signal from one of said m oscillators in accordance with the symbol of said input signal, and said variable phase shifter means are each connected in series to the output side of one of said m-ary FSK modulating means.

24. The signal multiplexer of claim 22, wherein said m-ary FSK modulating means each comprise m oscillators of different oscillation frequencies, and signal switching means for selectively outputting the oscillation signal from one of said m oscillators in accordance with the symbol of said input signal, and said variable phase shifter means are each connected in series to an input port of one of said m-ary FSK modulating means to which said reference frequency signal is input.

25. The signal multiplexer of claim 23, wherein said m-ary FSK modulating means are each constructed by a PLL frequency synthesizer, and said variable phase shifter means are each connected in series to an output side of one of said m-ary FSK modulating means.

26. The signal multiplexer of claim 24, wherein said m-ary FSK modulating means are each constructed by a PLL frequency synthesizer; and said variable phase shifter means are each connected in series to an input port of one of said m-ary FSK modulating means to which said reference frequency signal is input.

27. The signal multiplexer of claim 22, wherein said m-ary FSK modulating means and said variable phase shifter means in each of said channels are constructed by a directed digital frequency synthesizer.

28. The signal multiplexer of any one of claims 22 to 27, further comprising:

n branching means each for branching said input signal in said each channel for supply to both one of said m-ary FSK modulating means and said control means; and delay means provided in a path of said input signal between said each branching means and said m-ary FSK modulating means corresponding thereto.

29. The signal multiplexer of any one of claims 22 to 27, wherein frequency converting means is provided at the output side of said power combining means to convert said combined signal therefrom to a high-frequency signal.

30. The signal multiplexer of claim 29, wherein low-pass filter means is provided at the input side of said power combining means in each channel to limit the bandwidth of said modulated signal.

31. The signal multiplexer of any one of claims 22 to 27, wherein frequency converting means is provided at the input side of said power combining means in each channel to convert said modulated signal thereto to a high-frequency signal.

32. The signal multiplexer of claim 31, wherein low-pass filter means is provided at the input side of each of said frequency converting means to limit the bandwidth of said modulated signal.

33. The signal multiplexer of any one of claims 22 to 27, wherein band-pass filter means is provided at the input side of said power combining means in each channel to limit the bandwidth of said modulated signal.

34. The signal multiplexer of any one of claims 22 to 27, wherein said control means has storage means for phase shift amounts to be set in said variable phase shifter means in accordance with the combination of symbols of said n input signals.

35. The signal multiplexer of any one of claims 22 to 27, wherein said control means has means for sequentially calculating the phase shift amounts to be set in said variable phase shifter means in accordance with the combination of symbols of said input signals.

36. The signal multiplexer of any one of claims 22 to 27, wherein said control means has control signal processing means for processing a control signal to control the phase shift amounts of said variable phase shifter means so that the phase of each FSK modulated signal to be input into said power combining means is continuous.

37. The signal multiplexer of any one of claims 22 to 27, further comprising:

n variable attenuating means each connected in series to the output side of one of said m-ary FSK modulating means;

means for detecting the envelope power level of the combined output signal from said power combining means; and control means for setting predetermined attenuation amount in p ones of said variable attenuating means for a predetermined period of time when said detected envelope power level exceeds a predetermined value, where $p \leq n$.

38. The signal multiplexer of any one of claims 22 to 27, further comprising:

variable attenuating means connected in series to the output side of said power combining means;

means for detecting the envelope power level of the combined output signal from said power combining means; and control means for setting predetermined attenuation amount in said variable attenuating means for a predetermined period of time when said detected envelope power level exceeds a predetermined value.

* * * * *